(12) United States Patent  
Sommer

(10) Patent No.: US 8,986,449 B2  
(45) Date of Patent: Mar. 24, 2015

(54) DEVICE AND A METHOD FOR PROMOTING CRYSTALLISATION

(75) Inventor: Morten Sommer, Boston, MA (US)

(73) Assignee: Microlytic North America Inc., Burlington, MA (US)

( * ) Notice: Subject to any disclaimer, the term of this patent is extended or adjusted under 35 U.S.C. 154(b) by 1048 days.

(21) Appl. No.: 12/303,132

(22) PCT Filed: Jun. 27, 2007

(86) PCT No.: PCT/DK2007/050078
§ 371 (c)(1),
(2), (4) Date: Dec. 2, 2008

(87) PCT Pub. No.: WO2008/000276
PCT Pub. Date: Jan. 3, 2008

(65) Prior Publication Data
US 2009/0264632 A1    Oct. 22, 2009

Related U.S. Application Data

(60) Provisional application No. 60/816,868, filed on Jun. 28, 2006.

(30) Foreign Application Priority Data

Jun. 28, 2006 (DK) .................................. 2006 00863

(51) Int. Cl.
*C30B 35/00* (2006.01)
*C30B 29/58* (2006.01)
(Continued)

(52) U.S. Cl.
CPC ............ *C30B 29/58* (2013.01); *B01L 3/502738* (2013.01); *C30B 7/00* (2013.01);
(Continued)

(58) Field of Classification Search
USPC ............ 117/200; 422/50, 55, 58, 68.1, 81, 82, 422/99, 100, 101, 102, 103, 104
See application file for complete search history.

(56) References Cited

U.S. PATENT DOCUMENTS 6,409,832 B2    6/2002  Weigl et al.
6,908,594 B1 *  6/2005  Schaevitz et al. ............. 422/503
(Continued)

FOREIGN PATENT DOCUMENTS

EP    0 992 287 A2    4/2000
EP    1 419 818 A1    5/2004
(Continued)

OTHER PUBLICATIONS

Form PCT/ISA/210 (International Search Report) dated Jan. 29, 2008.
(Continued)

*Primary Examiner* — Matthew Song
(74) *Attorney, Agent, or Firm* — Buchanan Ingersoll & Rooney PC

(57) ABSTRACT

The invention relates to a microfluidic device for promoting crystallization of target molecules, such as proteins. The device comprises a solid structure with a top face and an opposite bottom face and with a least one liquid channel. The liquid channel comprises a target molecule solution inlet and at least two precipitant inlets. The target molecule solution inlet is in liquid communication with each of the precipitant inlets through the liquid channel. The liquid channel comprises a branching channel section adjacent to the target molecule solution inlet, crystallization channel sections adjacent to the respective precipitant inlets and flow break channel sections arranged between the branching channel section and each of the crystallization channel sections. The liquid channel is branched from 1 to X in the branching channel section, wherein X is the number of crystallization channel sections, and the flow break channel sections comprise a flow break arrangement capable of breaking up the liquid communication between said respective branching channel section and crystallization channel sections.

34 Claims, 10 Drawing Sheets

(51) Int. Cl.
  *B01L 3/00* (2006.01)
  *C30B 7/00* (2006.01)

(52) U.S. Cl.
  CPC ........ *C30B 35/00* (2013.01); *B01L 2200/0605* (2013.01); *B01L 2300/041* (2013.01); *B01L 2300/0816* (2013.01); *B01L 2300/0864* (2013.01); *B01L 2400/0406* (2013.01); *B01L 2400/0688* (2013.01); *B01L 2400/0694* (2013.01)
  USPC .............. 117/200; 422/50; 422/68.1; 422/81; 422/82

(56) References Cited

U.S. PATENT DOCUMENTS

| | | | |
|---|---|---|---|
| 2002/0064885 A1* | 5/2002 | Bedingham et al. | 436/174 |
| 2002/0150512 A1 | 10/2002 | Kellogg et al. | |
| 2002/0158195 A1 | 10/2002 | Andersson et al. | |
| 2002/0166582 A1 | 11/2002 | O'Connor et al. | |
| 2003/0027348 A1 | 2/2003 | DeLucas et al. | |
| 2003/0061687 A1 | 4/2003 | Hansen et al. | |
| 2003/0075101 A1* | 4/2003 | Weigl et al. | 117/200 |
| 2004/0043479 A1* | 3/2004 | Briscoe et al. | 435/288.5 |
| 2004/0096358 A1 | 5/2004 | Blankenstein et al. | |
| 2005/0031494 A1 | 2/2005 | Harms et al. | |
| 2005/0205005 A1 | 9/2005 | Hansen et al. | |
| 2007/0037295 A1* | 2/2007 | Vangbo et al. | 436/514 |
| 2008/0118399 A1* | 5/2008 | Fleming | 422/68.1 |

FOREIGN PATENT DOCUMENTS

| | | |
|---|---|---|
| JP | 2002541455 A | 12/2002 |
| JP | 2004500241 A | 1/2004 |
| WO | 0060345 A1 | 10/2000 |
| WO | WO 01/30490 A1 | 5/2001 |
| WO | 0175415 A2 | 10/2001 |
| WO | WO 2004/067174 A1 | 8/2004 |
| WO | 2005053827 A1 | 6/2005 |
| WO | WO 2006/065705 A2 | 6/2006 |

OTHER PUBLICATIONS

Page et a., "Shotgun Crystallization Strategy for Structural Genomics: an Optimized Two-Tiered Crystallization Screen Against the Thermotoga Maritima Proteome" Acta Crystallographica, 2003, D59, pp. 1028-1037.

English language translation of Japanese Office Action (Notification of Reasons for Rejection) dated Sep. 24, 2014, issued in corresponding Japanese Patent Application No. 2013-108417.

* cited by examiner

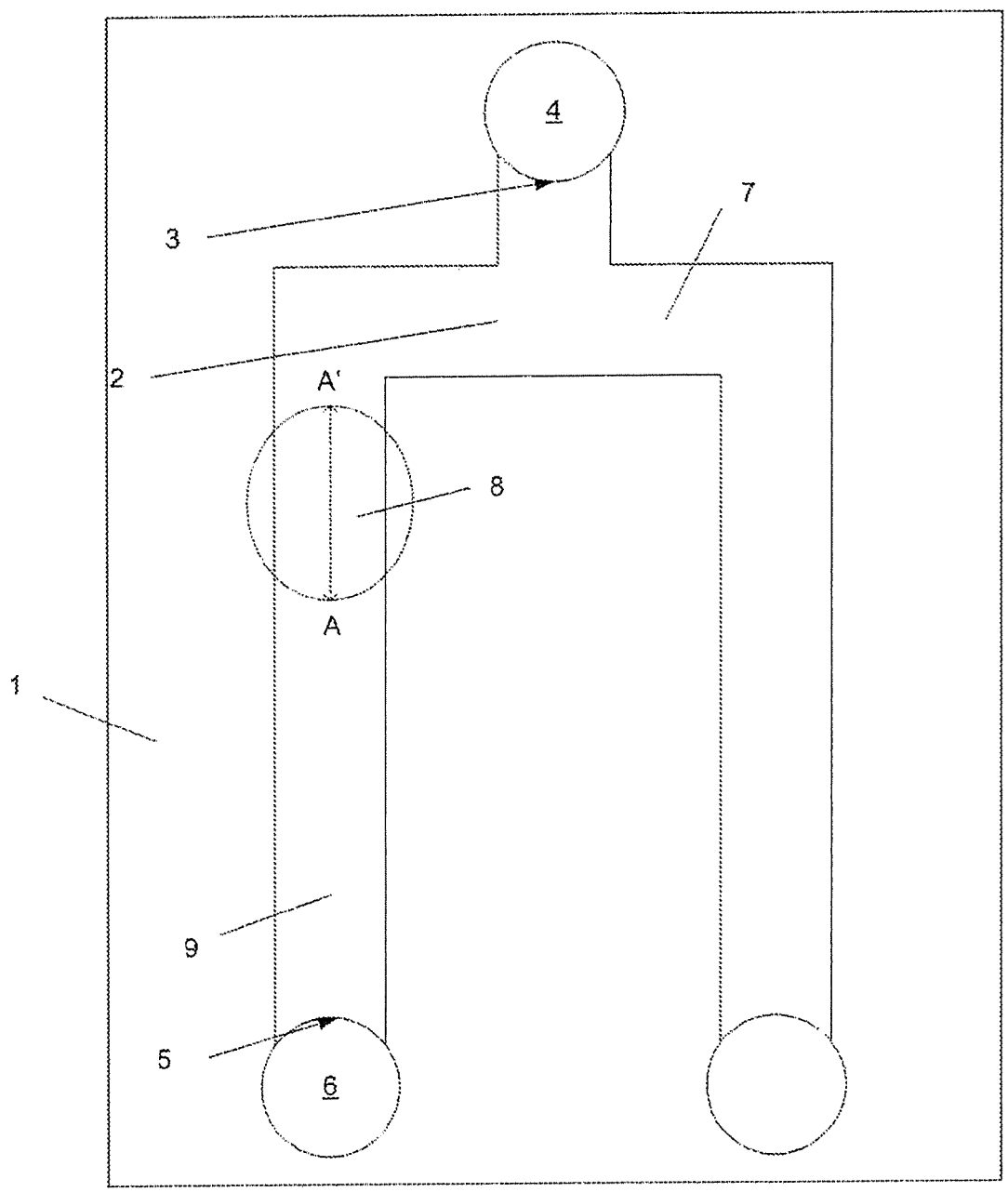
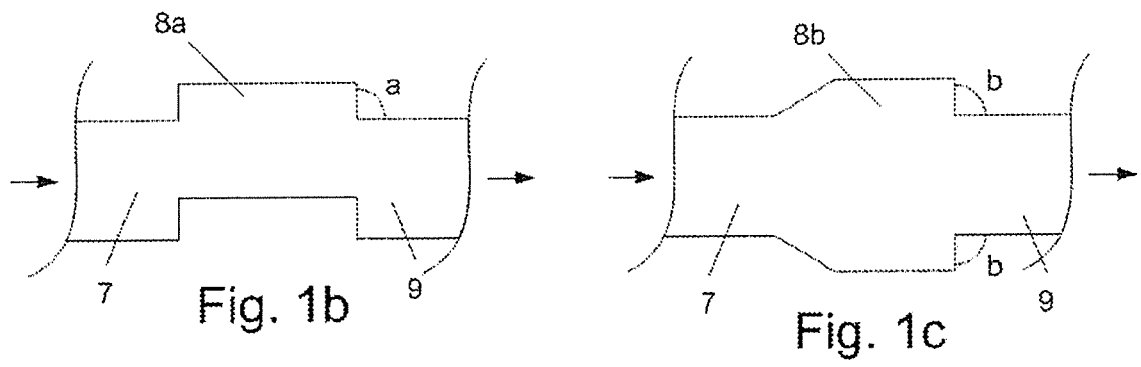
Fig. 1a
Fig. 1b
Fig. 1c

DEVICE AND A METHOD FOR PROMOTING CRYSTALLISATION

TECHNICAL FIELD

The invention relates to a microfluidic device for promoting target molecule crystallisation growth and in particular growth of macromolecules such as proteins, nucleic acids and/or carbohydrates. The invention also relates to a method of promoting crystallisation using said device. The invention also relates to a microfluidic device for simple harvesting of crystallized macromolecules.

BACKGROUND ART

Crystallisation of molecules, such as macromolecules, is an important technique for the biochemistry art. Biochemical molecules, such as nucleic acids, proteins and carbohydrates have unpredictable crystallisation structures, and often the 3D structure of the crystallized molecules play an important role for their biological functions. To get detailed knowledge about the way a protein functions it is critical to determine the three dimensional structure of the protein, since 3D structure and function are very tightly coupled. When biological processes need to be manipulated, the 3D structure is particularly useful, which is seen in medical research. Today more that 90% of the drugs on the market are small ligands that interact with a protein. To understand this interaction and to exploit it in the creation of new and improved drugs, the 3D structure of the ligand-protein complex has to be determined.

Crystallisation of molecules e.g. macromolecules, such as proteins is performed by providing a solution of the target compound, and altering the chemical environment of the dissolved target compound such that the target becomes less soluble and reverts to its solid form in crystalline form. This change in chemical environment is typically accomplished by introducing a precipitant that makes the target compound less soluble.

U.S. Pat. No. 6,409,832 describes a microfluidic device for promoting protein crystal growth using liquid-liquid diffusion. The device comprises one or more mixing and crystallisation chambers each comprising an inlet for a protein solution and an opposite inlet for a crystallization agent (precipitant). The protein solution is introduced via protein inlet into filling chambers with a specific volume, and there from it enters into the mixing chamber. The crystallization agent is filled via the crystallization agent inlets into the mixing chambers and the liquids are mixed using liquid-liquid diffusion.

US 2003/61687 discloses different microfluidic systems for use in high throughput screening of crystallization of a target material. The crystallisation is accomplished by introducing a solution of the target material into a plurality of chambers of a microfabricated fluidic device. The microfabricated fluidic device is then manipulated to vary the solution condition in the chambers, thereby simultaneously providing a large number of crystallization environments. The microfluidic system comprises an elastomeric block including the microfabricated chambers.

The system for crystallizing a target material comprises an elastomeric block including a microfabricated chamber configured to contain a volume of a solution of the target material, and a microfabricated flow channel in fluid communication with the chamber, the flow channel introducing a volume of a crystallizing agent into the chamber. The structure is manipulated to vary the solution condition in the chambers by deforming the elastomeric material to block fluid flow or to open for fluid flow or to metering an amount of fluid.

The crystallization system may further comprise an isolation structure configured to selectively isolate the chamber from the flow channel by deforming an elastomeric wall as the flow channel receives a volume of a crystallizing agent, and then to place the chamber into contact with the flow channel to alter a solution condition within the chamber. Alternatively, the crystallization system may further comprise a control channel overlying the chamber and separated from the chamber by a membrane, the membrane deflectable into the chamber to exclude a calibrated volume of sample solution from the chamber, such that relaxation of the membrane draws the calibrated volume of the crystallizing agent into the chamber. Further alternatively, the crystallization system may comprise a plurality of first parallel flow channels in fluid communication with a target material, and a plurality of second parallel flow channels orthogonal to and intersecting the first flow channels to create a plurality of junctions, the second flow channels in fluid communication with a crystallizing agent such that an array of solution environments can be created at the junctions.

WO 2004/067174 discloses an apparatus for performing microchemistry. The apparatus comprises a vapour permeable microfluidic chip channel structure with a supply conduit. The chip structure has first and second opposed ends to enable first and second fluid materials to interact by flowing the first and second fluid materials towards one another from the opposed ends of the supply conduit, and a valve mechanism in the chip structure operable to open and close the supply conduit at an intermediate position located between the first and second ends thereof whereby the chip structure is sequentially movable from a filling state in which the intermediate position is closed to enable the fluid materials to be blind-filled in the supply conduit on opposed sides of the intermediate position and an interaction state in which the intermediate position is open to enable the fluid materials to interact. The apparatus further comprises a vaporizer for forming a vaporous environment about the chip structure to compensate for evaporation of the fluid materials from the supply conduit of the chip structure in the interaction state.

US 2005/0205005 discloses a microfluidic structure for use in high throughput screening of protein crystallization. The microfluidic structure comprises a mixing chip allowing for precise metering of reagents to rapidly create a large number of potential crystallization. The microfluidic structure is of a micro machined elastomeric material having flow channels is several layers for providing a valve structure.

The objective of the invention is to provide a device for promoting crystallisation of target molecules, which device is simple and inexpensive to produce, and simple to operate.

The objective of the invention is also to provide a simple method for operating the device.

These objectives have been achieved by the invention as it is defined in the claims. And as it will be explained below, the invention and embodiments of the invention exhibit further beneficial properties compared with prior art crystallisation devices and methods.

DISCLOSURE OF INVENTION

The device of the invention for promoting crystallisation of target molecules has thus shown to be very economical compared with prior art devices. The basic reasons for this are that it is inexpensive to produce and simultaneously very simple and fast and reliable in use.

The term 'for promoting crystallisation of target molecules' includes both the formation of the first crystals (crystal germs), as well as further growing of crystals. For some test it is desired to examine small crystals, for other test it may be desired to allow the crystal growth to proceed until larger crystals are formed.

The microfluidic device of the invention comprises a solid structure with a top face and an opposite bottom face and with a least one liquid channel. The top and bottom face may e.g. be essentially flat and optionally parallel, for simple handling e.g. manually or by a robot. The liquid channel comprises a target molecule solution inlet and at least two precipitant inlets, wherein the target molecule solution inlet is in liquid communication with each of the precipitant inlets through the liquid channel. The target molecule inlet is open or at least accessible from the outside for filling target molecule solution into the liquid channel, e.g. via a membrane using a needle or via an opening through the solid structure e.g. in the top face for example as described in preferred embodiments below.

The liquid channel comprises a branching channel section adjacent to said target molecule solution inlet, crystallisation channel sections adjacent to said respective precipitant inlets and flow break channel sections arranged between said branching channel section and each of said crystallization channel sections.

In one embodiment the microfluidic device may also comprise flow break channel sections arranged between the crystallization channel sections and the precipitant inlets as further described below.

In the branching channel section the liquid channel is branched from 1 to X, wherein X is the number of crystallisation channel sections. X may in principle be any integer. In one embodiment X is between 2 and 1000, such as between 2 and 400, such as between 4 and 100, such as between 8 and 48, such as between 8 and 24.

The flow break channel sections comprise a flow break arrangement capable of breaking up the liquid communication between said respective branching channel section and crystallisation channel sections.

By the device it is thus possible to perform a plurality of crystallisation tests, while only adding a target molecule solution to one target molecule solution inlet. The target molecule solution will flow into the plurality of crystallisation channel sections where it can be contacted with a precipitant from a precipitant inlet. Simultaneously any fluid communication between the various crystallisation channel sections can be broken at the branching channel section which is arranged between the branching channel section and the crystallisation channel sections. Thus a very simple device has been provided which is simple to handle and where a plurality of crystallisation tests can be performed simultaneously.

In principle the flow break arrangement may be provided by any structure which can effectively break the fluid communication between the various crystallisation channel sections. In practice it has been found that an effective flow break arrangement may be in the form of a difference in the respective flow break channel sections or a difference in the solid structure providing said flow break channel sections selected from at least one of a) the branching channel section, and b) the crystallisation channel sections adjacent to said respective flow break channel sections.

Preferably the flow break arrangement is in the form of at least one of a) a capillary flow break wherein at least one flow break channel section is arranged to provide a lower capillary force to a liquid in said channel than the capillary forces provided to the liquid by said adjacent crystallisation channel section, b) a channel displacement, wherein at least a part of the flow break channel is displaced vertically with respect to at least one of the branching channel section and the crystallisation channel section, and c) a weakening line flow break wherein said solid structure is provided with a weakening line crossing the liquid channel in at least one flow break channel section.

A vertical displacement of a channel section means a displacement to a higher or lower position seen in relation to the top face of the device.

In practice the properties of the target molecule solution may be important when designing an optimal device, in particular for embodiments comprising a flow break channel section working according to a) or b) above. This is because the properties, and in particular the surface tension of the target molecule solution is decisive for whether or not the solution will be subjected to a capillary pull or not. When designing the microfluidic device water may be used as a replacement for the target molecule solution, even though for some applications the microfluidic device may be further optimized when using the specific target molecule solution. As it will be explained below, the target molecule solution may preferably be an aqueous solution and e.g. an aqueous solution comprising surfactants, which will alter its surface tension compared to water. The skilled person will however be able to regulate the design parameters by using his ordinary skill.

In one embodiment of the microfluidic device at least one flow break channel section is arranged to provide a lower capillary force to a liquid in said channel than the capillary forces provided to the liquid by said adjacent crystallisation channel section, said flow break channel section being provided with capillary flow stop arranged by its geometrical shape and/or its surface tension.

When a liquid is flowing in a microfluidic channel preferably under capillary forces with a certain velocity, the flow will continue over a section with lower or none capillary forces until the liquid has been completely de-accelerated. In the device this effect is used in this embodiment. The various sections of the channel are arranged so that when a target molecule solution is flowing in the branching channel section, it will continue to flow into the flow break channel section even though this flow break channel section is arranged to provide a lower capillary force to a liquid than the capillary forces provided to the liquid by the adjacent crystallisation channel section. The flow continues until the target molecule solution enters the crystallisation channel sections wherein the target molecule solution is subjected to capillary forces and thereby fills the crystallisation channel sections. When the flow has stopped because the crystallisation channel sections is filled, the target molecule solution will not flow back in the flow break channel section because the flow break channel section is arranged to provide a lower capillary force to the target molecule solution than the capillary forces provided to the liquid by the adjacent crystallisation channel section, and preferably also the branching channel section. Eventually the flow break channel section will be drained and liquid communication between the respective crystallisation channel sections will be broken.

The flow break channel section may be arranged to provide a lower capillary force to the liquid than the capillary forces provided to the liquid by the adjacent crystallisation channel section/the branching channel section by any arrangement. In the art of microfluidic devices a plurality of methods for arranging desired capillary properties are known, and the skilled person may use any suitable arrangement.

In one embodiment wherein the liquid channel comprises a wall surfaces extending along the circumference of the channel and in the length of the channel, the wall surface in at least one flow break channel section, in at least a part of its circumference has a lower surface tension than the surface tension of the adjacent wall surface in the adjacent crystallisation channel section to thereby provide a flow break arrangement. In this embodiment it is preferred that the surface in at least one flow break channel section, in at least in the major part of its circumference, such as al least 60%, such as at least 80%, such as at least 90% such as at least in essentially all of its circumference has a lower surface tension than the surface tension of the adjacent wall surface in the adjacent crystallisation channel section to thereby provide a flow break arrangement.

In one embodiment the wall surface in at least one flow break channel section, in at least a part of its circumference has surface tension which is significant lower (e.g. measured using contact angle measurement), such as at least 5 dynes/cm, such as at least 10 dynes/cm, such as at least 20 dynes/cm lower than the surface tension of the adjacent wall surface in the at least one of the adjacent crystallisation channel section and the adjacent branching channel section, preferably the wall surface in at least one flow break channel section, in at least a part of its circumference has surface tension which is less than 73 dynes/cm such as less than 60 dynes/cm, such as between 10 and 55 dynes/cm.

Surface tension may e.g. be measured using contact angle. For a surface with a surface tension of less than 73 dynes/cm the contact angle to water/sample is at least 90 degrees measured in air at 20° C. All measurements are performed in air and at 20° C. unless other is mentioned.

The surface energy and the surface tension are two terms covering the same property of a surface and in general these terms are used interchangeably. The surface energy of a surface may be measured using a tensiometer, such as a SVT 20, Spinning drop video tensiometer marketed by DataPhysics Instruments GmbH. In this application the term 'surface tension' is the macroscopic surface energy, i.e. it is directly proportional to the hydrophilic character of a surface which may e.g. be measured by contact angle to a drop of water as it is well known to the skilled person. In comparing measurements, e.g. when measuring which of two surface parts has the highest surface energy, it is not necessary to know the exact surface energy and it may be sufficient to simply compare which of the two surfaces has the lower contact angle to water.

In one embodiment the flow channel including the flow break section is of non-elastomeric material. Thereby the shape and the size of the channels remain reliably. Furthermore, elastomeric valve structures should preferably be avoided because such elastomeric valve structures normally are difficult to handle and may not be reliably. Furthermore it has shown that closing of an elastomeric valve by compressing the liquid channel adjacent to the crystallization channel may disturb the diffusion of the precipitant into the target molecule solution and thereby disturb the crystallization of the macromolecule. It is thus in desired that the flow break channel section is essentially non-compressible, i.e. the flow break channel section cannot be elastically compressed, preferably the flow break channel section cannot be elastically compressed to close the channel.

In order to establish a capillary flow of a specific liquid in a flow channel, at least some of the surface of the flow channel wall needs to have a surface energy which can drive the liquid forward. According to a well known theory, which however should not be interpreted so as to limit the scope of the invention, a capillary flow can only be established if at least some of the surface of the flow channel wall has a contact angle to the liquid in question which is less than 90°. In principle the lower the angle is, the faster the flow will be. In this connection it can also be mentioned that the surrounding air also may influence the contact angle between the liquid and the flow channel wall according to Young's equation which links the contact angle, the liquid-vapour surface tension of the drop, and the surface tension of solid in contact with liquid.

Contact angle measurement is used as an objective and simple method to measure the comparative surface tensions of solids. The Young equation states that the surface tension of a solid is directly proportional to the contact angle. The equation is:

$$g(sv) = g(lv)(\cos q) + g(sl),$$

where g(sv) is the solid-vapour interfacial surface tension, g(lv) is the interfacial surface tension of the liquid-vapour interface, g(sl) is the interfacial surface tension between solid and liquid, and (q) is the contact angle.

The channel may in principle have any cross-sectional shape, such as ellipsoidal, semi ellipsoidal, quadrilateral polygonal, square, rectangular and trapezoidal shape. The cross-sectional shape may vary or it may be uniform along its length. One channel section may for example have a first cross-sectional shape, and another section of the same liquid channel may have another cross-sectional shape.

In one embodiment of the microfluidic device wherein said liquid channel at least in its flow break channel section has a quadrilateral polygonal cross-sectional shape providing a bottom surface, an opposite top surface and two side surfaces, preferably at least the side surfaces and one of the bottom and top surfaces have a surface tension which is less than 73 dynes/cm (the contact angle to water/sample being at least 90 degrees), such as less than 60 dynes/cm, such as between 10 and 55 dynes/cm.

In one embodiment of the microfluidic device wherein said liquid channel comprises a wall surface extending along the circumference of the channel and in the length of the channel, said wall surface in at least one of the branching channel section and the crystallisation channel sections, in at least a part of its circumference has surface tension which is at least 60 dynes/cm, such as at least 73 dynes/cm, such as at least 75 dynes/cm, such as at least 80 dynes/cm, such as at least 80 dynes/cm. In one embodiment the wall surface in at least one of the branching channel section and the crystallisation channel sections, in at least a part of its circumference has a contact angle to water or preferably a target molecule solution which is less than 90 degrees.

In one embodiment of the microfluidic device wherein the liquid channel comprises a wall surface extending along the circumference of the channel and in the length of the channel, the liquid channel in at least one of the branching channel section and the crystallisation channel sections, has a quadrilateral polygonal cross-sectional shape providing a bottom surface, an opposite top surface and two side surfaces, preferably at least the bottom surface and the side surfaces have a surface tension which is at least 60 dynes/cm, such as at least 73 dynes/cm, such as at least 75 dynes/cm, such as at least 80 dynes/cm, or for example the contact angle to water/target molecule solution being less than 90 degrees.

In one embodiment of the microfluidic device wherein the flow break channel section is provided with capillary flow stop arranged at least partly by its geometrical shape, the smallest cross-sectional dimension of the channel along the flow break channel section is larger than the smallest cross-sectional dimension of the channel along at least one of the adjacent branching channel section and crystallisation channel sections.

In one embodiment of the microfluidic device wherein the flow break channel section is provided with capillary flow stop arranged at least partly by its geometrical shape, the flow break channel section has a larger cross sectional area than the cross sectional area of at least one of the adjacent branching channel section and crystallisation channel sections.

The geometrically arranged flow stop should be arranged so that the flow will not be stopped when filling the crystallisation channel sections due to the velocity of the liquid as described above, However, when the crystallisation channel sections are filled, the liquid will be prevented from flowing back into the flow break channel section due to the geometrically arranged flow stop. The skilled person will be able to provide a flow stop e.g. by selecting a suitable angle of the edge between the flow channel sections.

In one embodiment of the microfluidic device the liquid channel comprises an abrupt change of at least one cross sectional dimension in the flow break channel section immediately adjacent to one or both of the adjacent branching channel section and crystallisation channel section.

As it is well known to the skilled person, such sharp edge may provide a capillary barrier which may delay or even stop a liquid from passing this edge.

In one embodiment of the microfluidic device at least one flow break channel section has a larger cross-sectional area than the cross-sectional area of the adjacent crystallisation channel section. The liquid channel comprises a wall surfaces extending along the circumference of the channel and in the length of the channel. In this embodiment it is desired that the larger cross-sectional area of the at least one flow break channel section is formed by a step-wise displacement of the wall surface at least along the major part of the circumference of the channel in the flow break channel section immediately adjacent to the crystallisation channel section.

In one embodiment of the microfluidic wherein the liquid channel has a quadrilateral polygonal cross-sectional shape providing a bottom surface, an opposite top surface and two side surfaces, this larger cross-sectional area of the at least one flow break channel section is formed by a step-wise displacement of at least the bottom surface and the side surfaces of the flow break channel section compared to the adjacent crystallisation channel section.

This step-wise displacement of the wall surface preferably at least along the major part of the circumference of the channel in the adjacent flow break channel section and crystallisation channel section may preferably be formed as a step displacement.

In one embodiment said step-wise displacement of the wall surface preferably at least along the major part of the circumference of the channel in the flow break channel section immediately adjacent to the crystallisation channel section forms an edge having an angle of 120 degrees or less, such as of 100 degrees or less, such as of 90 degrees or less, such as 80 degrees or less.

The angle of the edge is measured as the smallest angle through the solid structure, from edge surface of the crystallisation channel to edge surface of the step forming the step-wise displacement.

The larger cross-sectional area of the at least one flow break channel section resulting from such step-wise displacement of the wall surface preferably at least along the major part of the circumference of the channel in the flow break channel section may have any size larger than the cross sectional area of the adjacent crystallisation channel section. The cross-sectional area of at least one flow break channel section may preferably have a size which is at least 10%, such as at least 30%, such as at least 50%, such as at least 100%, such as at least 150%, such as at least 200%, such as at least 500%, such as at least 1000% larger than the cross sectional area of the adjacent crystallisation channel section.

In embodiments where the cross-sectional area of the at least one flow break channel section is much larger, such as 500% larger or more than the cross sectional area of the adjacent crystallisation channel section, the necessary amount of target molecule solution for performing a test will be relatively large in order to effectively fill out the crystallisation channel sections.

In embodiments where the cross-sectional area of the at least one flow break channel section is only slightly larger, the risk of backflow of target molecule solution from the crystallisation channel sections may be increased. The skilled person will be able to select a preferred size ratio of the channel sections in relation to a specific test type. In practice the optimal channel size ratios will in particular depend on the type and availability of the target molecules and the properties, including the surface tension of the target molecule solution.

In one embodiment of the microfluidic device the liquid channel comprises at least one flow break channel section provided by a channel displacement. Preferably the flow break channel section is displaced to a higher position than at least the adjacent crystallisation channel section and more preferably the at least one flow break channel section is also displaced to a higher position than the branching channel section. The higher position is seen in relation to the top face of the device. In this embodiment it is desired that the at least one flow break channel section is displaced with respect to the crystallisation channel sections to a level whereby liquid (such as water or the target molecule sample) is prevented from flowing back from the crystallisation section to the branching section when the device is held in horizontal plane.

In this embodiment it may be desired that the flow break channel section besides being displaced also has a larger cross-sectional area than the adjacent crystallisation channel sections and/or at is formed geometrically and/or with surfaces properties to provide a less capillary force to water and/or a target molecule solution.

In one embodiment of the microfluidic device where the liquid channel comprises at least one flow break channel section provided by a channel displacement and/or by the flow break channel being arranged to have a lower capillary forces than the crystallization channel, the microfluidic device being provided with a drain off opening, which during loading of the target molecule solution is closed e.g. by a plug or a vent and which after the crystallization channel being filled is opened to drain off excess amounts of target molecule solution and simultaneously provide or participating in providing the flow break in the flow break channel.

In one embodiment of the microfluidic device the solid structure is provided with a weakening line crossing the liquid channel in at least one flow break channel section. The weakening line may preferably cross over essentially the whole device, e.g. crossing over essentially all of the top face and/or the bottom face. The weakening line is simultaneously crossing two or more flow break channel sections, such as all of the flow break channel sections.

The weakening line is a line with a lower strength than the surrounding of the solid structure, so that when a bending force is applied to the device the device will break along said weakening line. When the device is broken along a weakening line, the device will also break in the flow break channel section crossed by said weakening line, and thereby the liquid channel will be provided with an abrupt opening along a side of the microfluidic device. Due to the small size of the liquid channel, the liquid inside such liquid channel will not flow out, but will remain within the channel due to capillary forces. In order to avoid evaporation of the liquid, the openings of the channel may be sealed with a sealant e.g. as described below.

The slit may in principle have any form. It may for example be a continuous slit unbroken in length, or it may be dotted. In one embodiment the weakening line is in the form of a slit crossing the whole device in at least one of the top face and the bottom face, the slit is preferably shaped as one of a V shape and a U shape, wherein the V/U shape may in one embodiment be and in another embodiment may not be symmetric about the vertical axis.

The slit should be sufficiently deep to provide the desired weakening, so that the device upon being subjected to a bending force will break along said slit. In one embodiment the slit has a depth of at least 10% of the thickness of the microfluidic device, such as at least 15%, such as between 30 and 90%, such as between 35 and 80% of the thickness of the microfluidic device adjacent to the slit, wherein the thickness of the microfluidic device is defined as the distance between the top face and its opposite bottom face.

The target molecule solution may be added directly to the target molecule solution inlet, e.g. by contacting the target molecule solution inlet to a sample e.g. placed on or in a secondary device, e.g. a well or a test-tube, or applied by an instrument such as a pipette. In one embodiment the microfluidic device of the invention comprises a target molecule solution inlet cavity for feeding a target molecule solution into the target molecule solution inlet. The target molecule solution inlet cavity may e.g. be formed as a depression in the top face of the solid structure leading directly to the target molecule solution inlet.

In one embodiment the target molecule solution inlet cavity is in the form of a cavity in said top face, said cavity is in liquid communication with said branching channel section through said target molecule solution inlet, said target molecule solution inlet cavity preferably has a conical shape from the top surface to the target molecule solution inlet.

The target molecule solution inlet cavity may have any desired volume. In one embodiment the target molecule solution inlet cavity has a volume which is as least the total volume of the crystallisation channel sections, such as at least 2 times the volume of the crystallisation channel sections such as at least 1.5 times, such as at least 1.3 times, such as at least 1.2 times, such as at least 1.1 times, such as fore example between 0.05 and 20 µl, such as between 0.1 and 10 µl, such as between 0.2 and 5 µl, such as between 0.5 and 3 µl.

In one embodiment of the microfluidic device each of the two or more precipitant inlets are arranged to be in liquid communication with a precipitant cavity. The device preferably comprises at least one precipitant cavity for each precipitant inlet, however in one embodiment two or more precipitant inlets are in liquid communication with the same precipitant cavity.

In one embodiment the precipitant cavity is enclosed within the device except for an opening from the precipitant cavity to the precipitant inlet. This is referred to as a semi-closed cavity. In this embodiment it is desired that the only opening to the precipitant cavity is via the precipitant inlet. Alternatively precipitant may be feed via a membrane in a wall area of the precipitant cavity or the precipitant cavity may be prefilled prior to fixing the elements of the solid structure to each other to provide the precipitant cavity. The precipitant may e.g. be in dry state in the prefilled precipitant cavity.

In the embodiment comprising a semi-closed precipitant cavity, the device should preferably comprise an arrangement for allowing air to escape when the target molecule solution is fed to the device, for allowing it to enter the crystallisation channel sections. Such arrangement may e.g. be in the form of air holes in the device leading to the respective crystallisation channel sections preferably arranged in the vicinity to the precipitant inlet or air holes arranged in the precipitant cavities. These air holes may comprise a blocking element, e.g. a plate, such as a glass plate, which can be applied to block the air holes if and when desired.

The precipitant cavities may e.g. be formed as a depression in the top face of the solid structure leading directly to the precipitant inlet.

In one embodiment of the microfluidic device the precipitant cavities are in the form of an inlet cavity in said top face, said cavity is in liquid communication with said crystallisation channel sections through said precipitant inlet, said precipitant inlet cavity preferably has a conical shape from the top surface to the target molecule solution inlet.

The precipitant cavities may in one embodiment have a smallest distance to each other of at least 0.1 mm, such as between 0.5 and 5 mm, such as between 1 and 3 mm, such as between 1.5 and 2.5 mm.

In one embodiment of the microfluidic device, at least one crystallisation channel section has a capillary stop arranged in or adjacent to the precipitant inlet, the capillary stop preferably being provided by step-wise, and preferably steep enlargement from the crystallisation channel section to a precipitant cavity. Preferably all of the crystallisation channel sections have a capillary stop arranged in or adjacent to their adjacent precipitant inlet.

Thereby the crystallisation channel sections can be filled by target molecule solution from the target molecule solution inlet by using capillary force, without simultaneously filling the precipitant cavity. The liquid front of the target molecule solution will stop flowing at the provided capillary stop. If a precipitant is thereafter filled into the precipitant cavity, the target molecule solution and the precipitant will be in contact for diffusion and the crystallisation test can be performed.

The step-wise enlargement from the crystallisation channel section to the precipitant cavity may preferably form an edge having an angle of 120 degrees or less, such as of 100 degrees or less, such as of 90 degrees or less, such as 80 degrees or less.

The angle of the edge is measured as the smallest angle through the solid structure, from edge surface of the crystallisation channel to edge surface of the step of the step forming the step-wise displacement.

The precipitant cavity may have any desired volume for example a volume is between 0.01 and 10 µl, such as between 0.02 and 5 µl, such as between 0.5 and 2 µl, such as between 0.7 and 1.3 µl.

The microfluidic device may be made from one singe part, but in general such one-part microfluidic device is difficult to produce. Preferably the microfluidic device is made from two or more parts of equal or different material, which parts have been connected to each other. The parts may be connected to each other using any means for example gluing, welding and/or mechanical clamping.

The bond may e.g. a chemical bond involving one or more bonds selected from ionic bonds and covalent bonds. In one embodiment the bond between the two or more parts is performed by welding, such as a thermal pressure bond, and ultrasonic bond.

The microfluidic device may be made from any suitable material. The various parts of the microfluidic device may be of equal or different materials. In one embodiment the microfluidic device comprises at least one part made from a material selected from the group consisting of glass, ceramics, metals, semiconductive materials, such as silicon, germanium and gallium arsenide, and polymers.

Semiconductor materials are materials with 4 electrons in their outer shell (it's half filled). When bonded together in a crystal lattice, atoms share electrons such that they each have eight electrons in the outer shell. Electrons are somewhat loosely bonded so they can become carriers in the presence of an electric field.

In one embodiment the microfluidic device comprises at least one part made from a semiconductive material selected from the group consisting of doped poly crystalline silicon, doped poly crystalline silicon germanium (poly SG), doped single crystalline silicon, doped single crystalline silicon germanium (SG) and doped III-V materials.

In one embodiment the microfluidic device comprises at least one part made from a polymer material, preferably an injection mouldable polymer, such as a polymer selected from the group consisting of acrylonitrile-butadiene-styrene copolymer, polycarbonate, polydimethylsiloxane (PDMS), polyethylene (PE), polymethylmethacrylate (PMMA), polymethylpentene, polypropylene, polystyrene, polysulfone, polytetrafluoroethylene (PTFE), polyurethane (PU), polyvinylchloride (PVC), polyvinylidene chloride (PVDC), polyvinylidine fluoride, styrene-acryl copolymers polyisoprene, polybutadiene, polychloroprene, polyisobutylene, poly(styrene-butadiene-styrene), silicones, epoxy resins, Poly ether block amide, polyester, acrylonitrile butadiene styrene (ABS), acrylic, celluloid, cellulose acetate, ethylene-vinyl acetate (EVA), ethylene vinyl alcohol (EVAL), fluoroplastics (PTFEs, including FEP, PFA, CTFE, ECTFE, ETFE), polyacetal (POM), polyacrylates (acrylic), polyacrylonitrile (PAN) polyamide (PA), polyamide-imide (PAI), polyaryletherketone (PAEK), polybutadiene (PBD), polybutylene (PB), polybutylene terephthalate (PBT), polyethylene terephthalate (PET), polycyclohexylene dimethylene terephthalate (PCT), polyketone (PK), polyester/polythene/polyethene, polyetheretherketone (PEEK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), and mixtures thereof, preferably at least one part of the device being transparent for optical inspection.

When using polymer it is in one embodiment preferred that the polymer has a Youngs Modulus E of at least 0.2 GPa, such as at least 0.5 GPa, such as at least 1 GPa. Thereby the material will have a reliably stiffness for performing the crystallization.

In one embodiment the microfluidic device comprises at least one part made from a cyclic olefin co-polymer, such as PET, Zeonor® (marketed by ZEON Corporation), Zeonex® (marketed by ZEON Corporation) and Topas® (marketed by Topas Advanced Polymers GmbH). These materials are in particular useful for the production of the removable lid(s) described below.

In one embodiment wherein the microfluidic device is made from at least two parts connected to each other, at least one of the parts comprises a weakening line in the form of a slit.

In one embodiment of the invention the microfluidic device is made from at least a bottom part (providing the bottom face) and a top part (providing the top face), at least one of the bottom part and the top part comprise grooves for providing the liquid channel. The grooves should be arranged in the surface opposite to respectively the bottom face and the top face. Furthermore at least one of the bottom part and the top part comprise apertures for the target molecule solution inlet cavity and the precipitant inlet cavities, said bottom part and said top part preferably being essentially rigid.

In one embodiment the microfluidic device is made from a bottom part and a top part fixed to each other by gluing, welding and/or mechanical clamping to thereby form the liquid channel between the parts.

In general it is most simple to weld the two parts together. However in embodiment where the two parts are clamped together the harvesting of grown crystal may be very simple as disclosed below.

In one embodiment the microfluidic device is made from at least a bottom part, a top part and a sealing part in the form of a sealing layer. The top part comprises grooves in the side opposite to the top face for providing the liquid channel and optionally aperture for target molecule solution inlet cavity and apertures/depressions for the precipitant cavities. The sealing part is sandwiched between the top part and the bottom part so that the sealing part covers said grooves and said apertures, and the bottom part supports said sealing part. In this embodiment the bottom part may preferably be in the form of an essentially featureless plate, preferably made from glass or polymer.

The bottom part preferably supports the sealing layer at least in the area where the sealing layer cover said grooves of the top part to form the crystallisation channel sections. The said top part may comprise one or more weakening lines crossing the crystallisation channel section, said weakening lines may preferably be a part of the top part extending beyond the bottom part, so that the device can be broken along said weakening line without breaking the bottom layer.

In one embodiment wherein the microfluidic device is made from at least a bottom part and a sealing part in the form of a sealing layer, the top part comprises grooves for providing the liquid channel and optionally aperture for target molecule solution inlet cavity and apertures/depressions for the precipitant cavities. The sealing part is connected with the top part so that the sealing part covers said grooves and said apertures. Thereby the liquid channel can be formed.

The sealing part should be selected to be of a material which can provide the necessary tightness, or alternatively a sealant e.g. a wax may be provided to tighten the device. In one embodiment the sealing part is of a polymer material with a hardness of 90 shore A or less, such as between 20 and 70 shore A.

As example of preferred polymer material for the sealing part can be mentioned elastomers more preferably selected from the group consisting of thermoplastic elastomers and rubbers. A suitable material for the sealing part is PDMS.

The sealing part may in one embodiment preferably be in the form of an essentially featureless plate.

In one embodiment the microfluidic device further comprises a weakening line crossing preferably all of the crystallisation channel sections, whereby the device can be broken along said weakening line. The weakening line may be provided as described above, for example the weakening line may be provided in a top part of the microfluidic device.

The weakening line may preferably be arranged in said the structure to cross said crystallisation channel sections adjacent to said respective precipitant inlets.

For simple production and handling of the microfluidic device the top face and an opposite bottom face may in one embodiment be essentially even except for the inlet cavities and optionally precipitant cavities and/or weakening line.

The capillary properties of the device depend on several factors such as it is well known to the skilled person. The capillarity depends as described above on the surface tension and, the structure and the size of the liquid channel. The term 'capillary dimension' means that the liquid channel has such properties which will result in a capillary pull in a liquid sample which is water and/or the target molecule solution.

In one embodiment of the microfluidic device the liquid channel in the major part of its length has capillary dimension, preferably said liquid channel in at least the branching channel section and the crystallisation channel sections has capillary dimension.

In one embodiment of the microfluidic device the liquid channel in the major part of its length has at least one cross-sectional dimension below 1000 µm, such as between 10 µm and 250 µm, such as between 20 µm and 100 µm, preferably said liquid channel in at least the branching channel section and the crystallisation channel sections has at least one cross-sectional dimension below 1000 µm, such as between 10 µm and 250 µm, such as between 20 µm and 100 µm.

In one embodiment of the microfluidic device the liquid channel at least in said crystallisation channel sections, preferably in all of its length has a quadrilateral polygonal cross-sectional shape providing a bottom surface, an opposite top surface and two side surfaces, said quadrilateral polygonal cross-sectional shape preferably being a trapezoidal shape with the two side surfaces having an angle between above 90 degrees and 120 degrees such as between 90 and 110 degrees, such as between 90 and 100 degrees, such as between 90 and 95 degrees to the bottom surface.

In one embodiment of the microfluidic device the liquid channel at least in the crystallisation channel sections has a cross-sectional shape with a width and a height, the height being the average distance between the bottom surface and the top surface and the width being the average distance between the two side surfaces, the width and the height preferably, individually of each other, being between 10 and 300 µm.

The branching channel section may comprise one, two, three or more sites of branching. In each branching site the channel may be branched into two or more channels.

The optimal length of the flow break channel section depends largely on which type of flow break is provided. In general it is desired that the flow break channel section has a length of from 1 to 10000 µm, such as from 5 to 5000 µm, such as from 10 to 1000 µm, such as from 20 to 200 µm.

In one embodiment of the microfluidic device wherein said flow break arrangement is in the form of a weakening line crossing the liquid channel, said flow break channel section has a length of up to about 5000 µm, such as up to about 4000 µm, such as up to about 3000 µm, such as up to about 1000 µm such as up to about 1000 µm such as up to about 100 µm, such as between 1 and 50 µm e.g. at least 10 µm. defined as the length of the liquid channel crossed by the weakening line wherein the width of the weakening line is measured in plane with the top face.

In one embodiment of the microfluidic device wherein said flow break arrangement is in the form of a capillary stop in the liquid channel, said flow break channel section has a length of up to about 10 mm, such as between 1 and 10000 µm, such as between 10 and 5000 µm, such as between 20 and 2000 µm.

The crystallisation channel sections may preferably each have a length of from 10 to 50000 µm, such as from 20 to 30000 µm, such as from 40 to 15000 µm, such as from 100 to 10000 µm.

For simplifying the structure the said crystallisation channel sections may preferably be arranged essentially parallel to each other.

In one embodiment of the invention the microfluidic device comprises at least a first part having a first face and a groove face with grooves for providing at least the crystallization channel sections of the liquid channel and at least one lid part providing a plurality of at least partly removable lids, each having a second face and a groove face, wherein said removable lids is applied above and sealed along the grooves to provide at least the crystallization channel sections of the liquid channel.

In one embodiment the first face of the first part is the top face and the second face or second faces of the lid part(s) provides the bottom face. In another embodiment the first face of the first part is the bottom face and the second face or second faces of the lid part(s) provides the top face.

The first part may e.g. be a molded and or micro-machined item. In one embodiment the first part is made from an essentially plane plate into which grooves have been engraved using laser. By using laser the groove may be formed in a very simple manner to in practice having any desired shape.

The one or more lid parts is/are applied above the grooves to form the liquid channel. In practice it is desired to apply the lid part in one piece and then during or after the application provide the lid part with the desired cuts for providing the removable lids. A removable lid is a lid which by tearing can be removed to expose at least a part of a crystallization channel section, preferably to expose the major part of at least one crystallization channel section.

By such a removable lid a crystallized macromolecule can be harvested in a very simple manner. Further more only the lids covering the crystallization channel section or sections with the desired crystallized macromolecules needs to be exposed for the harvesting, and the remaining crystallization channel sections may be allowed additional time for further crystallization. In other words, it will not be necessary to wait until no further crystallization can be expected until harvesting desired crystals.

The target molecule solution inlet may be provided as described above. Preferably the target molecule solution inlet is provided by a one through going opening in the first part. Alternatively the target molecule solution inlet is provided by a depression as described above.

The precipitant inlets may also be as described above. In one embodiment the first part have at least one through going opening for providing a precipitant inlet into the liquid channel. Alternatively the precipitant inlet is provided by a depression as described above.

By providing the inlets in the form of through going openings in the first part the microfluidic device can be provided in a very simple way.

The removable lids may preferably extend beyond the first part, e.g. so that the removable lids provide flanges for individually removing the respective lids In one embodiment the removable lids each comprises a flange which is not bonded to the first part and which is arranged such that by tearing in said flange the respective lids are removed from the respective crystallization channel sections. The desired crystallization channel sections may thus be exposed for harvesting in a simple and handy way.

The removable lids may preferably be sealed to the groove face of the first part along the respective grooves by gluing and/or welding. The sealing line may e.g. be a relatively thin line e.g. less than 0.5 mm, such as 2 mm or less, which e.g. simultaneously provides a partly or totally cutting between adjacent removable lids. Broader sealing lines may naturally also be used, but in such situations a separate step for cutting between adjacent removable lids may be necessary or the individual removable lids may be applied individually.

In one embodiment the removable lids are releasable connected to each other e.g. along the sealing lines. The releasable connection between adjacent removable lids along sealing lines should preferably have a strength which is essentially lower, such as half or lower than the intrinsic strength of the material of which the lids are made, such that upon tearing the releasable connection will break prior to tearing the lid material.

In one embodiment the microfluidic device comprises 3 or more removable lids. The number of removable lids may preferably be adjusted to the number of crystallization channel sections. Preferably the microfluidic device comprises a removable lid for each of said crystallization channel sections.

The microfluidic device may e.g. be provided by any of the materials described above. In one embodiment the first part is of a material selected from the group consisting of glass, ceramics, metals, semiconductive materials, such as silicon, germanium and gallium arsenide, and polymers having a Young Modulus of at least 0.2 GPa, such as of at least 0.5 GPa, such as of at least 1 GPa. The first part may preferably be essentially transparent.

The one or more lid part(s) may preferably be made from a foil, such as a polymer foil or a metal foil. Desired materials for the lid part(s) are disclosed above.

In one embodiment the foil for the lids is applied onto the groove face of the first part, glued or welded to the groove face along the grooves and partly or totally cut in sections to provide said removable lids. Other methods for the production may naturally also be used and will be available to the skilled person.

In one embodiment the microfluidic device further comprises a membrane incorporated in at least one of said crystallization channel sections, preferably adjacent to said respective precipitant inlets.

The membrane may e.g. reduce the amount of the target molecule migrating out of the crystallisation channel sections via the precipitant inlet and into the precipitant. In many situations the target molecule is larger than the precipitant which means that the precipitant can pass through the membrane, but the target molecules cannot.

The membrane may for example be a filter membrane preventing the target molecules from diffusing into a precipitant in liquid contact with the precipitant inlet, said membrane preferably being a porous membrane made from one or more of the materials selected from the group consisting of fibrous material, such as glass fibers melt blown, spunbonded synthetic fibers (e.g., nylon, polyester, polyethylene, polypropylene, or polyethersulfone), semi-synthetic fibers, regenerated fibers, and inorganic fibers and mixtures; and foamed polymer, more preferably said membrane being porous nitrocellulose.

In one embodiment the membrane may have a surface tension which is closer to the surface tension of the precipitant than the target molecule solution.

In one embodiment, the microfluidic device is in combination with a target molecule solution. The target molecule solution may e.g. be as disclosed herein e.g. in an aqueous solution. The aqueous solution may be free of detergents or it may optionally comprise one or more detergents.

The microfluidic device may preferably be provided for the target molecule solution, this means that the desired capillary forces within the liquid channel should be measured in relation to the target molecule solution. Thus in one embodiment the microfluidic device comprises at least one flow break channel section arranged to provide a lower capillary force to the target molecule solution in said channel than the capillary forces provided to the target molecule solution by said adjacent crystallisation channel section.

In one embodiment of the microfluidic device in combination with a target molecule solution said liquid channel comprises a wall surface extending along the circumference of the channel and in the length of the channel, said wall surface in at least one flow break channel section, in at least a part of its circumference has a lower surface tension than the surface tension of the target molecule solution. In this or in another embodiment the wall surface in at least one crystallisation channel section, in at least a part of its circumference may have a surface tension which is higher than the surface tension of the target molecule solution.

In one embodiment of the microfluidic device in combination with a target molecule solution the liquid channel comprises a wall surface extending along the circumference of the channel and in the length of the channel, said liquid channel at least in one crystallisation channel section has a quadrilateral polygonal cross-sectional shape providing a bottom surface, an opposite top surface and two side surfaces, preferably at least the bottom surface and the side surfaces have a surface tension which is higher than the surface tension of the target molecule solution.

In one embodiment of the microfluidic device in combination with a target molecule solution the liquid channel comprises a wall surface extending along the circumference of the channel and in the length of the channel, said wall surface in said branching channel section, in at least a part of its circumference has surface tension which is higher than the surface tension of the target molecule solution.

In one embodiment of the microfluidic device in combination with a target molecule solution the liquid channel in the major part of its length has capillary dimension, preferably said liquid channel in at least the branching channel section and the crystallisation channel sections has capillary dimension, the capillary dimension being determined in relation to the target molecule solution.

The microfluidic device in combination with a target molecule solution may further be as disclosed above wherein any relation between the liquid channel and the liquid adapted to flow within it is measured in relation to the target molecule solution.

The invention also relates to a method of promoting target molecule crystallisation from a target molecule solution using a microfluidic device as described above.

The method of the invention comprises:
i) providing a target molecule solution, feeding the target molecule solution to the target molecule solution inlet and allowing it to fill up the crystallisation channel sections;
ii) providing at least one precipitant and arranging it to become in liquid communication with at least one precipitant inlet and thereby to become in contact with the target molecule solution;
iii) allowing the precipitant to diffuse into the target molecule solution in the crystallisation channel sections, and
iv) breaking up the liquid communication between said respective target molecule crystallization channel sections.

The steps i) and ii) can be made in any order.

The step iv) can be made anytime after step i) has been terminated.

The target molecules may in principle be of any kind which is desired to crystallize. The target molecules may be organic or inorganic. Most often the molecules will be biomolecules i.e. molecules which originate from a biological specimen or artificial analogues thereto. Preferably the target molecule solution is a solution of at least one kind of target molecules selected from the group consisting of proteins, nucleic acids, nucleic acids analogues, carbohydrates, lipids more preferably selected from the group of proteins of 500 Dalton or more, single and double stranded DNA, RNA, PNA and LNA, and drug candidates. The term protein includes peptides as well as larger proteins.

In a preferred embodiment the target molecule is a protein selected from the group of protein of 500 Dalton or more.

As indicated above the solution may comprise other elements e.g. for stabilising the solution, e.g. polymer such as polyethylene glycol, and surfactant including detergents.

The concentration of the various elements may vary largely.

Examples of detergents and concentration are found in table 1. Usually a target molecule solution will comprise only one type of detergent; however combinations of detergents may also be applied.

MW: molecular weight.
CMC: critical micelle concentration.
Actual: typical concentration used.

TABLE 1

| Detergent | MW | CMC (mM) | [Actual] (mM) |
|---|---|---|---|
| C12E9 | 583.10 | 0.1 | 0.8 |
| C12E8 | 539.10 | 0.1 | 1.1 |
| n-Dodecyl-β-D-maltoside | 510.60 | 0.2 | 1.7 |
| Sucrose monolaurate | 524.60 | 0.2 | 2.0 |
| CYMAL ®-6 | 508.50 | 0.6 | 5.6 |
| TRITON ® X-100 | 631.00 | 0.9 | 9.0 |
| CTAB | 364.50 | 1.0 | 10.0 |
| Deoxy BigChap | 862.10 | 1.4 | 14.0 |
| n-Decyl-β-D-maltoside | 482.60 | 1.8 | 18.0 |
| LDAO | 229.40 | 2.0 | 20.0 |
| CYMAL ®-5 | 494.50 | 2.4 | 24.0 |
| ZWITTERGENT ®3-12 | 335.60 | 4.0 | 40.0 |
| Nonyl-β-D-glucoside | 306.40 | 6.5 | 65.0 |
| 1-s-Octyl-β-D-thioglucoside | 308.40 | 9.0 | 90.0 |
| DDAO | 201.40 | 10.4 | 104.0 |
| HECAMEG | 335.40 | 19.5 | 195.0 |
| n-Octanoylsucrose | 468.50 | 24.4 | 244.0 |
| Heptyl-β-D-thioglucoside | 274.30 | 30.0 | 300.0 |
| n-Octyl-β-D-glucoside | 292.40 | 24.5 | 245.0 |
| CYMAL ®-3 | 466.50 | 34.5 | 345.0 |
| C-HEGA-10 | 377.50 | 35.0 | 350.0 |
| ZWITTERGENT ® 3-10 | 307.60 | 40.0 | 400.0 |
| MEGA-8 | 321.40 | 79.0 | 790.0 |
| n-Hexyl-β-D-glucoside | 264.30 | 250.0 | 2500.0 |
| Pluronic ® F-68 | ~8350 | None | 10% w/v |
| Anapoe ® 35 | None | None | 10% v/v |
| n-Dodecyl-β-D-maltotrioside | 672.78 | 0.2 | 2 mM |
| Anapoe ® 58 | None | None | 10% v/v |
| Anapoe ® X-114 | None | None | 10% v/v |
| Anapoe ® X-305 | None | None | 10% v/v |
| Anapoe ® X-405 | None | None | 10% v/v |
| Anapoe ® 20 | 1227.54 | 0.059 | 10% v/v |
| Anapoe ® 80 | 1309.68 | 0.012 | 10% v/v |
| Anapoe ® C10E6 | 427.10 | 0.9 | 10% v/v |
| Anapoe ® C10E9 | None | None | 10% v/v |
| Anapoe ® C12E10 | None | None | 10% v/v |
| Anapoe ® C13E8 | None | None | 10% v/v |
| IPTG | 238.30 | None | 10% w/v |
| n-Dodecyl-N,N-dimethylglycine | 271.40 | 1.5 | 15.0 mM |
| HEGA-10 | 379.50 | 7.0 | 70.0 mM |
| C8E5 | 350.50 | 7.1 | 71.0 mM |
| CHAPS | 614.90 | 8.0 | 80.0 mM |
| CHAPSO | 630.90 | 8.0 | 80.0 mM |
| C-HEGA-11 | 391.50 | 11.5 | 115 mM |
| HEGA-9 | 365.50 | 39.0 | 390 mM |
| C-HEGA-9 | 363.50 | 108.0 | 1.08 M |
| HEGA-8 | 351.50 | 109.0 | 1.09 M |
| CYPFOS-3 | 293.30 | 180.0 | 1.80 M |
| BAM | 384.45 | None | 10% w/v |
| n-Hexadecyl-β-D-maltoside | 566.6 | 0.0006 | 0.006 mM |
| n-Tetradecyl-β-D-maltoside | 538.6 | 0.01 | 0.1 mM |
| n-Tridecyl-β-D-maltoside | 524.6 | 0.033 | 0.33 mM |
| Thesit ® | 582.9 | 0.09 | 0.9 mM |
| Zwittergent ® 3-14 | 363.6 | 0.4 | 4.0 mM |
| n-Undecyl-β-D-maltoside | 496.6 | 0.59 | 5.9 mM |
| n-Decyl-β-D-thiomaltoside | 498.6 | 0.9 | 9.0 mM |
| FOS-Choline ®-12 | 315.5 | 1.5 | 15.0 mM |
| n-Decanoylsucrose | 496.6 | 2.5 | 25 mM |
| 1-s-Nonyl-β-D-thioglucoside | 322.4 | 2.9 | 29.0 mM |
| n-Nonyl-β-D-maltoside | 484.6 | 3.2 | 32.0 mM |
| DDMAB | 299.5 | 4.3 | 43.0 mM |
| n-Nonyl-β-D-maltoside | 468.4 | 6 | 60.0 mM |
| Cymal ®-4 | 480.5 | 7.6 | 76.0 mM |
| n-Octyl-β-D-thiomaltoside | 470.6 | 9 | 90.0 mM |
| FOS-Choline ®-10 | 323.4 | 13 | 130 mM |
| FOS-Choline ®-9 | 309.4 | 19 | 190 mM |
| MEGA-9 | 335.5 | 25 | 250 mM |
| 1-s-Heptyl-β-D-thioglucoside | 294.4 | 29 | 290 mM |
| FOS-Choline ®-8 | 295.4 | 102 | 1.02 M |
| Cymal ®-2 | 452.5 | 120 | 1.20 M |
| Zwittergent ®-3-08 | 279.6 | 330 | 3.30 M |
| Cymal ®-1 | 438.5 | 340 | 3.4 M |

In one embodiment a gel-forming material may be added to the target molecule solution to at least partly solidify the solution to prevent undesired backflow Examples of useful gel-forming materials are agarose and acrylamide.

Useful precipitant and combination of precipitant are well known from the art. As specified above the precipitant may be applied in dry form or in a solution.

Examples of precipitant solution can be found in Shotgun crystallization strategy for structural genomics: an optimized two-tiered crystallization screen against the Thermotoga maritima proteome' by Page R, Grzechnik S K, Canaves J M, Spraggon G, Kreusch A, Kuhn P, Stevens R C, Lesley S A. ACTA CRYSTALLOGRAPHICA SECTION D-BIOLOGICAL CRYSTALLOGRAPHY 59: 1028-1037 Part 6, June 2003

The skilled person will know how to find and to select the precipitant for use in combination with selected target molecule solution.

The target molecule solution may in one embodiment be fed directly to the target molecule solution inlet, e.g. using a tool, such as a pipette, or by applying the target molecule solution in a target molecule solution inlet cavity as described above.

In one embodiment the target molecule solution is applied on a support e.g. in the form of a drop, the target molecule solution inlet is shaped as an inlet to a capillary channel, and by bringing the target molecule solution inlet in contact with the drop the drop will be sucked directly into the microfluidic device by capillary forces.

In order to provide a secure, uncontaminated and measured target molecule solution it is preferred that the microfluidic device comprises a target molecule solution cavity and that the target molecule solution is applied in said target molecule solution cavity.

Due to the structure/surface characteristics of the liquid channel of the microfluidic device, the target molecule solution will fill up the crystallisation channel sections.

In one embodiment the precipitant(s) are pre-filled into the precipitate cavities. As disclosed above the precipitant may in this embodiment preferably be in dried state. The precipitant may be re-soluted prior to or after filling in the target molecule solution, e.g. by injecting a liquid into the precipitant cavity e.g. via a membrane. Other examples are disclosed above.

In one embodiment the precipitant(s) are arranged to become in liquid communication with the respective precipitant inlets by applying the respective precipitant inlets into wells containing the precipitants.

In one embodiment the precipitant(s) are arranged to become in liquid communication with the respective precipitant inlet by feeding the precipitants into precipitant cavities in the device. In this embodiment the precipitant inlet may preferably be arranged such that the target molecule solution flows into the crystallisation channels sections but does not flow into the precipitant cavities. Specific examples of this are described above. In this embodiment the target molecule solution is applied prior to the precipitant.

In another embodiment the precipitant is prevented from flowing into the crystallisation channel sections e.g. by a membrane or a capillary stop as described above. In this example the precipitant may preferably be applied prior to the target molecule solution.

According to the method the microfluidic device may preferably be such that the liquid communication between said respective target molecule crystallization channel sections is broken up automatically, due to the internal capillary forces of the liquid channel or due to the displacement of the flow break channel sections as described above.

In one embodiment the liquid communication between said respective target molecule crystallization channel sections is broken up by breaking the device along a weakening line crossing the flow break channel sections. When the device is broken along the weakening line the liquid within the crystallisation channel sections will not flow out due to capillary forces within the crystallisation channel sections.

In one embodiment the precipitant is allowed to diffuse into the target molecule crystallization channel sections for a desired time, e.g. 1 hour or more, where after the liquid communication between the precipitant and the target molecule crystallization channel sections is terminated.

In order to prevent liquid from evaporating from the system it is desired that the channel opening to the environment surrounding the microfluidic device is sealed of. The method therefore preferably comprises sealing at least one, and preferably all inlets to the crystallization channel sections for avoiding evaporation there from.

Any sealing element/material may be used. In one embodiment the one or more inlets are sealed by one or more of the following
a) by adding a wax, such as a paraffin wax or a polyethylene wax to seal the inlet(s); and
b) by fixing (e.g. by gluing, welding or clamping) a locking element, such as a locking element made from polymer or glass, e.g. a polymer slide or a glass slide, the locking element preferably being transparent.

The method may preferably further comprise incubating the microfluidic device and allowing crystals to be formed and/or to grow. The incubating time depends on the type of target molecule solution. In general the most typical incubating times will be between 2 and 580 hours, such as between 24 and 240 hours. The incubation typically takes place in temperature controlled boxes, e.g. with a temperature of 25 degrees, 16 degrees, or 4 degrees. The temperature may influence the crystallisation and for some test, incubation at varying temperatures may be performed.

After incubation the microfluidic device is inspected e.g. visually or by a robot, to identify any crystal formation. The formed crystals may be examined in the liquid channel e.g. through a transparent wall section or they may be harvested for further examination.

In one embodiment the method of the invention further comprises harvesting formed/grown crystals from one or more of the crystallization channel sections, the crystals preferably being harvested by one or more of the following:
a) by breaking the device in at least two parts to separate parts that are forming the crystallization channel sections, and removing the crystals;
b) by selectively removing (e.g. cutting) a bottom part or top part of one or more selected crystallization channel section(s), and removing the crystals;
c) by sucking up or pressing out the crystals from the crystallization channel section(s); and
d) by removing a removable lid or lids to expose the desired crystallization channel section(s) whereby the crystals can be removed.

In a second aspect the invention relates to another microfluidic device for promoting crystallization of target molecules. This microfluidic device comprises a solid structure with a first face and an opposite second face and with a least one liquid channel, where the liquid channel comprises a target molecule solution inlet and at least one precipitant inlet. In other word, in this microfluidic device there need not be a branching section and/or a flow break section. The target molecule solution inlet being in liquid communication with the precipitant inlet through said liquid channel, and the liquid channel comprises a crystallization channel section adjacent to said precipitant inlet. This microfluidic device of this second aspect of the invention comprises at least a first part having a first face and a groove face with at least one groove for providing said crystallization channel section and at least one lid part providing an at least partly removable lid, said lid having a second face and a groove face, wherein said removable lid is applied above and sealed along said groove to said crystallization channel sections of the liquid channel.

In one embodiment the first face of the first part is the top face and the second face or second faces of the lid part(s) provides the bottom face. In another embodiment the first face of the first part is the bottom face and the second face or second faces of the lid part(s) provides the top face.

At least one of the first part or the lid part(s) is/are transparent.

The first part of this second aspect of the invention may be of the material as disclosed above and may be provided by similar methods. The first part may e.g. be a molded and or micro-machined item. In one embodiment the first part is made from an essentially plane plate into which grooves have been engraved using laser. By using laser the groove may be formed in a very simple manner to in practice having any desired shape.

The lid part is applied above the groove to form the liquid channel. In practice it is desired to apply the lid part in one piece and then during or after the application provide the lid part with any desired cuts for providing the one or more removable lids. A removable lid is a lid which by tearing can be removed to expose at least a part of a crystallization channel section, preferably to expose the major part of at least one crystallization channel section.

By such a removable lid a crystallized macromolecule can be harvested in a very simple manner. Further more only the lids covering the crystallization channel section or sections with the desired crystallized macromolecules needs to be exposed for the harvesting, and the remaining crystallization channel sections may be allowed to additional time for further crystallization. In other words, it will not be necessary to wait until no further crystallization can be expected until harvesting desired crystals.

The target molecule solution inlet may be provided a described above. Preferably the target molecule solution inlet is provided by a one through going opening in the first part. Alternatively the target molecule solution inlet is provided by a depression as described above.

The precipitant inlets may also be as described above. In one embodiment the first part have at least one through going opening for providing a precipitant inlet into the liquid channel. Alternatively the precipitant inlet is provided by a depression as described above.

By providing the one or more inlets in the form of through going openings in the first part the microfluidic device can be provided in a very simple way.

The removable lid(s) may preferably extend beyond the first part, e.g. so that the one or more removable lids provide flanges for individually removing the respective lids In one embodiment of the second aspect the removable lid comprises a flange which is not bonded to the first part and which is arranged such that by tearing in said flange the lid is removed from the crystallization channel section. The desired crystallization channel section(s) may thus be exposed for harvesting in a simple and handy way.

The removable lids may preferably be sealed to the groove face of the first part along the respective grooves by gluing and/or welding. The sealing line may e.g. be a relatively thin line e.g. less than 0.5 mm, such as 2 mm or less, which e.g. simultaneously may provide a partly or totally cutting between optional adjacent removable lids. Broader sealing lines may naturally also be used.

In one embodiment the microfluidic device of the second aspect comprises two or more liquid channels comprising a crystallization channel section and each connected to a target molecule solution inlet, and a precipitant inlet, each of said crystallization channel sections preferably being covered by a removable lid, which lids optionally are releasable connected to each other.

In case of two or more removable lids the lids may be as described above. In one embodiment the microfluidic device comprises two or more, such as 5 or more, such as 10 or more crystallization channel sections, and preferably said microfluidic device comprises a lid for each of said crystallization channel section.

The microfluidic device of the second aspect may e.g. be provided by any of the materials described above. In one embodiment the first part is of a material selected from the group consisting of glass, ceramics, metals, semiconductive materials, such as silicon, germanium and gallium arsenide, and polymers having a Young Modulus of at least 0.2 GPa, such as of at least 0.5 GPa, such as of at least 1 GPa. The first part may preferably be essentially transparent.

The at least one lid part is made from a foil, such as a polymer foil or a metal foil. Desired materials for the lid part(s) are disclosed above.

In one embodiment of the second aspect the foil for the lid(s) is applied onto the groove face of the first part, glued or welded to the to the groove face along the groove(s) and partly or totally cut in sections to provide said removable lids. Other methods for the production may naturally also be used and will be available to the skilled person.

The microfluidic device of the second aspect may additionally be combined with any of the feature disclosed above provided that it comprises at least one removable lid as defined above.

BRIEF DESCRIPTION OF DRAWINGS

Embodiments of the invention will be described more fully below and with reference to the drawings in which:

FIG. 1a shows a schematic view of a microfluidic device according to the invention.

FIGS. 1b and 1c show examples of flow break channel sections.

The figures are schematic and simplified for clarity, and they just show details which are essential to the understanding of the invention, while other details are left out. Throughout, the same reference numerals are used for identical or corresponding parts.

Figure 2A:
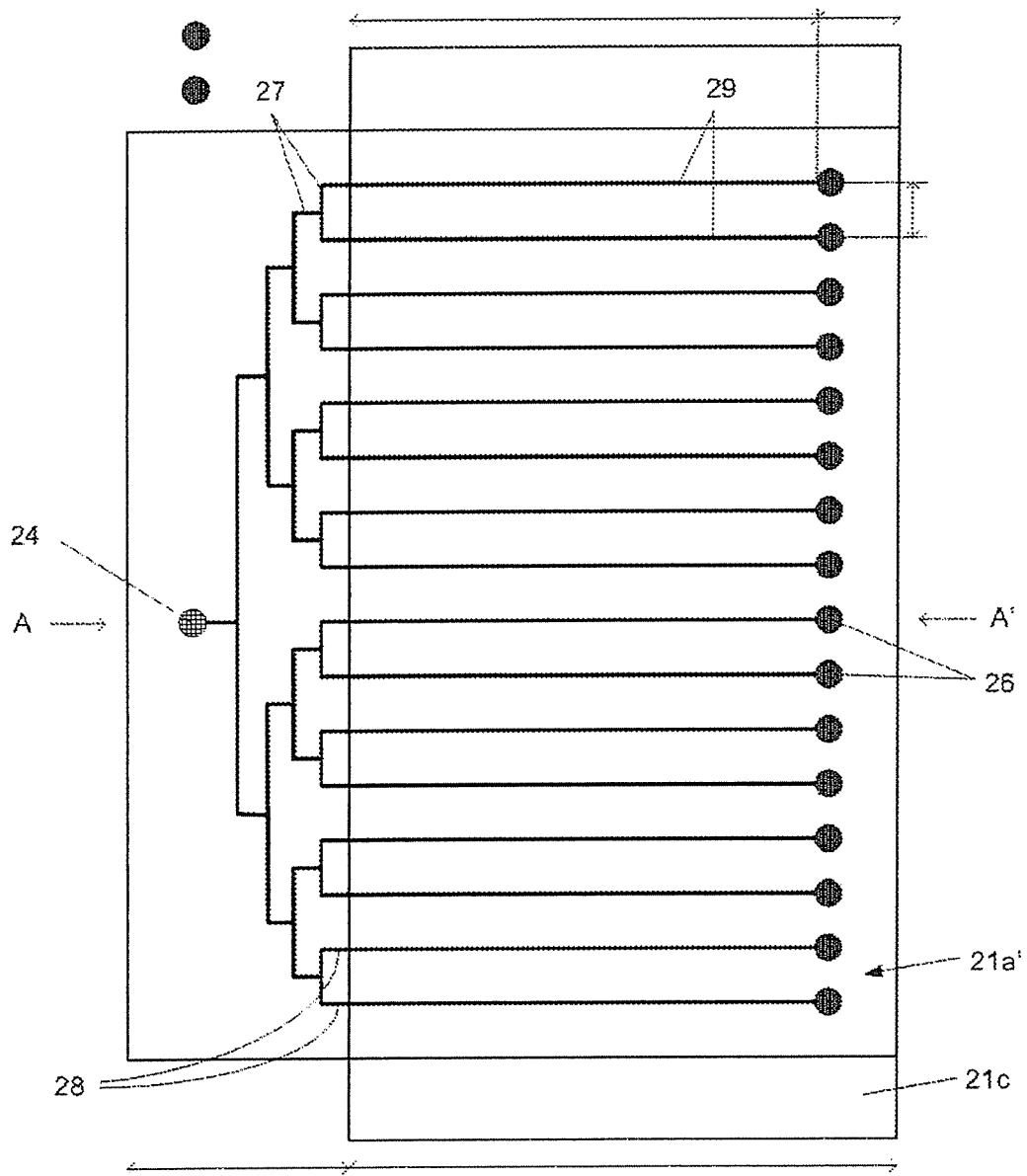
FIG. 2a is a top view of a microfluidic device of the invention comprising a flow break channel section in the form of a weakening line between a branching channel section and crystallisation channel sections.

The invention is illustrated schematically in FIG. 1 which shows a microfluidic device 1 comprising a liquid channel 2. The liquid channel 2 comprises an inlet 3 and target molecule solution inlet 4 optionally with a target molecule solution inlet cavity. The liquid channel 2 further comprises a precipitant inlet 5 optionally with a precipitant cavity 6 optionally covered with a not shown lid e.g. in the form of a membrane ad as described above.

The liquid channel 2 comprises 3 sections, namely a branching channel section 7, a flow break channel section 8 and crystallisation channel sections 9. In the FIG. 1 only 2 crystallisation channel sections are illustrated but as mentioned above the microfluidic device may have as many crystallisation channel sections as desired.

In use a target molecule solution is fed to the target molecule solution inlet 3 e.g. via a target molecule solution inlet cavity 4, and the target molecule solution will flow into the channel 2 and fill up crystallisation channel sections 9. A precipitant is fed into the precipitant cavity 6 either before or after the target molecule solution is fed to the liquid channel 2. If the target molecule solution is fed to the system prior to the precipitant, an arrangement as explained above is provided to prevent the target molecule solution from flowing into the precipitant cavity. If the precipitant is fed to the system prior to the target molecule solution, an arrangement as explained above is made to prevent the precipitant from filling up the crystallisation channel sections, for example the precipitant may be provided in dry state.

When both the target molecule solution and the precipitant are fed to the system, they will come into contact with each other at or near the precipitant inlet 5 and the precipitant will diffuse into the target molecule solution which eventually upon incubation will result in crystallisation of the target molecule.

After the target molecule solution has filled the crystallisation channel sections 9 the liquid communication between the branching channel section 7 and the crystallisation channel sections 9 is broken so that the various precipitants cannot flow into neighbouring crystallization channel sections 9. The flow break channel sections 8 are arranged to either break up the liquid communication by itself due to its structure and or surface characteristics, or a not shown weakening line is provided to allow the user in a simple and safe manner to break up the device along such flow break line and thereby break the liquid communication between the branching channel section 7 and the crystallisation channel sections 9.

As mentioned above any opening from the crystallisation channel sections 9 to the surrounding air may be blocked by adding a not shown sealant.

FIGS. 1b and 1c show examples of flow break channel sections 8a, 8b which could be taken in the cross sectional cut A-A' of FIG. 1.

FIG. 1b is a cross sectional view of the flow break channel section 8a. The arrow shows the flow direction of a target molecule solution when fed via the target molecule solution inlet 3. The flow break channel section 8a is in the form of a channel displacement, where the channel is displaced vertically with respect to the adjacent branching channel section 7 and crystallisation channel section 9. When the target molecule solution passes from the branching channel section 7, it will easily pass through the flow break channel section 8a and into the crystallisation channel section 9 due to the velocity of the liquid. When the liquid stops flowing, the remaining liquid in flow break channel section 8a will be drawn back into the branching channel section in case it is not completely filled up (which it should not be). Due to the sharp edge 'a' (e.g. having an angle of 120 degrees or less, such as of 100 degrees or less, such as of 90 degrees or less, such as 80 degrees or less) formed by this step-wise displacement of the wall surface, the target molecule solution will remain in the crystallisation channel section 9, but the flow break channel section 8a will be essentially drained.

FIG. 1c is a cross sectional view of another example of a flow break channel section 8b. The arrow shows the flow direction of a target molecule solution when fed via the target molecule solution inlet 3. The flow break channel section 8b is in the form of a displacement of the wall surrounding and forming the flow break channel section 8b, where flow break channel section 8b is increased in cross sectional dimension so that the capillary pull within the flow break channel section 8b will be less than the capillary pull in the adjacent branching channel section 7 and crystallisation channel section 9. When the target molecule solution passes from the branching channel section 7, it will easily pass through the flow break channel section 8b and into the crystallisation channel section 9 due to the velocity of the liquid. When the liquid stops flowing, the remaining liquid in flow break channel section 8b will be drawn back into the branching channel section due to the difference in capillary pull in the respective flow break channel section and branching channel section. Due to the sharp edge 'b' (e.g. having an angle of 120 degrees or less, such as of 100 degrees or less, such as of 90 degrees or less, such as 80 degrees or less) formed by this step-wise displacement of the wall surface, the target molecule solution will remain in the crystallisation channel section 9, but the flow break channel section 8b will be essentially drained.

Figure 2B:
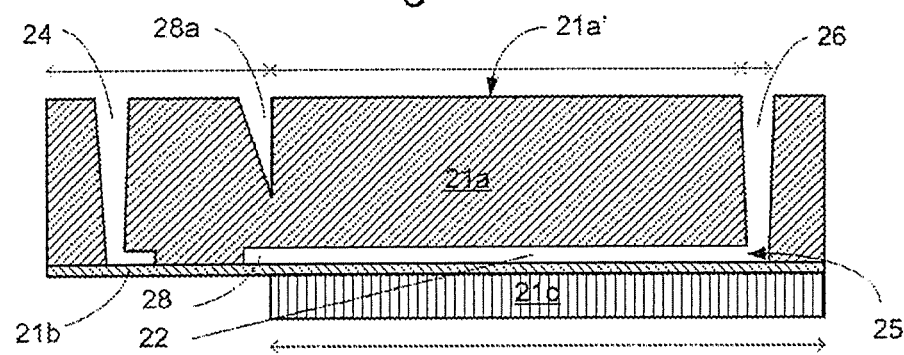
FIG. 2b is a cross sectional side view of the microfluidic device shown in FIG. 2a taken in the cut line A-A'.

FIGS. 2a and 2b show a microfluidic device of the invention comprising a flow break channel section 28 in the form of a weakening line between the branching channel section 27 and crystallisation channel sections 29. As shown in FIG. 2b, the device is provided in 3 layers formed by 3 parts:

- A top part 21a, with a top face 21a' and comprising grooves for providing the liquid channel 22, apertures for the precipitant cavities 26 adjacent to respective precipitant inlets 25, and the solution inlet cavity 24, and a slit 28a for providing the weakening line in the flow break section 28.
- A bottom part 21c in the form of an essentially featureless plate e.g. a glass plate.
- A sealing part 21b in the form of a sealing layer sandwiched between the top part 21a and the bottom part 21c so that the sealing part covers said grooves 22, 26, 24, 28 and apertures and the bottom part supports said sealing part 21b. The bottom part 21c supports the sealing part 21b where the sealing part covers the groove 22 of the first part 21a, in the part of the groove forming the crystallisation channel section 29, but the bottom part 21c does not extend beyond the flow break section 28, formed by the slit 28a. Thereby the microfluidic device can easily be broken in the weakening line without any need for breaking the bottom part 21c.

Figure 3A:
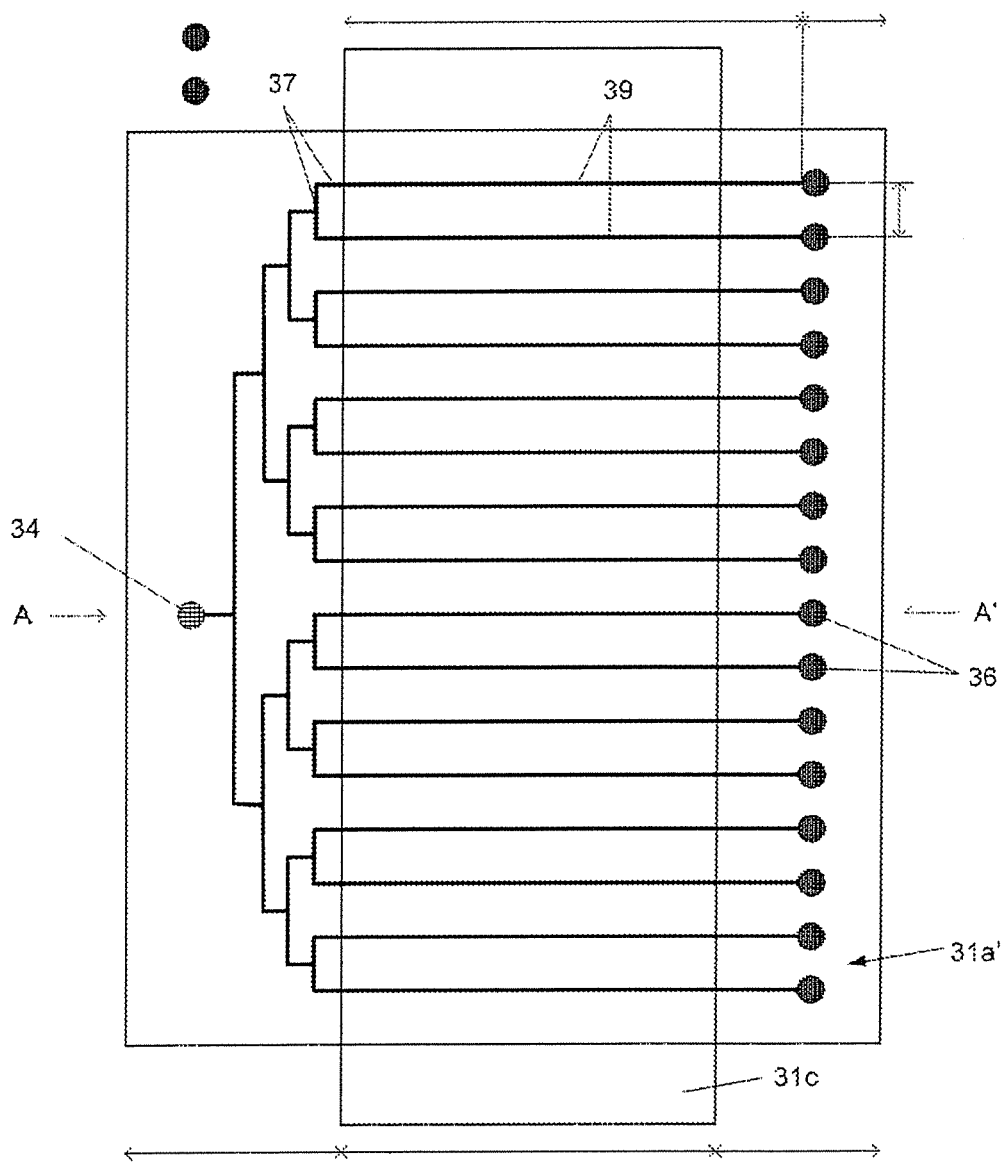
FIG. 3a is a top view of another microfluidic device of the invention comprising a flow break channel section in the form of a weakening line between a branching channel section and crystallisation channel sections and an additional flow break channel section in the form of a weakening line at the precipitant inlet.
Figure 3B:
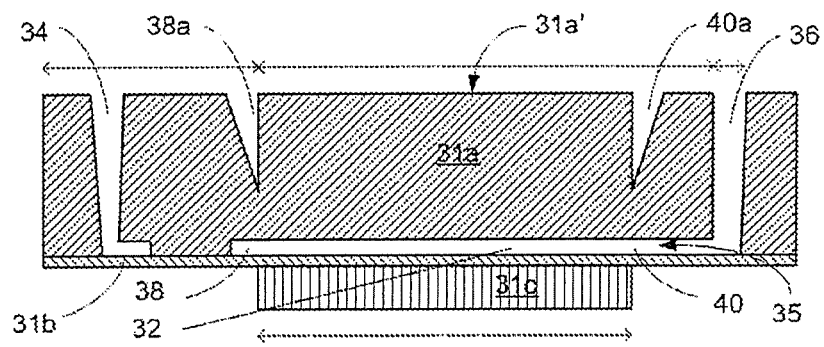
FIG. 3b is a cross sectional side view of the microfluidic device shown in FIG. 3a taken in the cut line A-A'.

FIGS. 3a and 3b show another microfluidic device of the invention. This microfluidic device is a variation of the microfluidic device shown in FIGS. 2a and 2b and comprises a flow break channel section 38 in the form of a weakening line between a branching channel section 37 and crystallisation channel sections 39 and an additional flow break channel section 40 in the form of a weakening line at the precipitant inlet 35. The device is provided in 3 layers formed by 3 parts:

- A top part 31a, with a top face 31a' and comprising grooves for providing the liquid channel 32, apertures for the precipitant cavities 36 adjacent to respective precipitant inlets 35, and the solution inlet cavity 34, and a slit 38a for providing the weakening line in the flow break section 38 and a slit 40a for providing the weakening line at the precipitant inlet 35.
- A bottom part 31c in the form of an essentially featureless plate e.g. a glass plate.
- A sealing part 31b in the form of a sealing layer sandwiched between the top part 31a and the bottom part 31c so that the sealing part covers said grooves 32, 36, 34, 38, 40 and apertures and the bottom part supports said sealing part 31b. The bottom part 31c supports the sealing part 31b where the sealing part covers the groove 32 of the first part 31a, in the part of the groove forming the crystallisation channel section 39, but the bottom part 31c does not extend beyond the flow break section 38, formed by the slit 38a and the flow break section 40, formed by the slit 40a. Thereby the microfluidic device can easily be broken in the weakening lines without any need for breaking the bottom part 31c.

FIGS. 4 a-d show another microfluidic device of the invention. This microfluidic device is a variation of the microfluidic device shown in FIGS. 3a and 3b, and differs there from in that it is provided in 2 layers:

- A top part 41a, with a top face 41a' and comprising grooves for providing the liquid channel 42, apertures for the precipitant cavities 46 adjacent to respective precipitant inlets 45, and the solution inlet cavity 44, and a slit 48a for providing the weakening line in the flow break section 48 and a slit 50a for providing the weakening line at the precipitant inlet 45.
- A sealing part also constituting a bottom part, and in the form of sealing layer applied to cover said grooves 42 and apertures 46, 44.

In use a target molecule solution is fed to the not shown target molecule solution inlet via the target molecule solution inlet cavity 44, and the target molecule solution will flow into the channel 42 and fill up crystallisation channel sections 49. Due to the step-wise enlargement from the crystallisation channel section 49 to the precipitant cavity 46 the target molecule solution will not flow into the precipitant cavity 46. The step-wise enlargement from the crystallisation channel section 49 to the precipitant cavity 46 forms an edge 'b', having an angle of approximately 90 degrees. This angle b, could have another size, but preferable less than 120 degrees.

A precipitant is fed into the precipitant cavity 46, and the target molecule solution and the precipitant come into contact with each other at or near the precipitant inlet 45 and the precipitant will diffuse into the target molecule solution which eventually upon incubation will result in crystallisation of the target molecule.

Figure 4A:
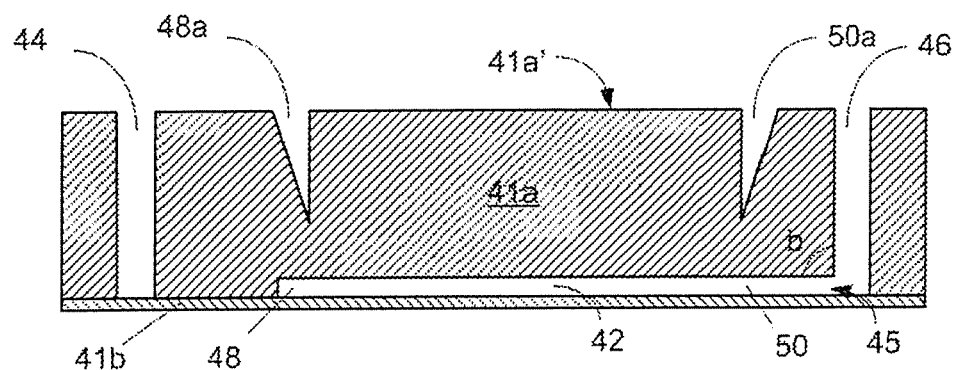
FIGS. 4a-d are cross sectional side views of a further microfluidic device of the invention in various states during use.
Figure 4B:
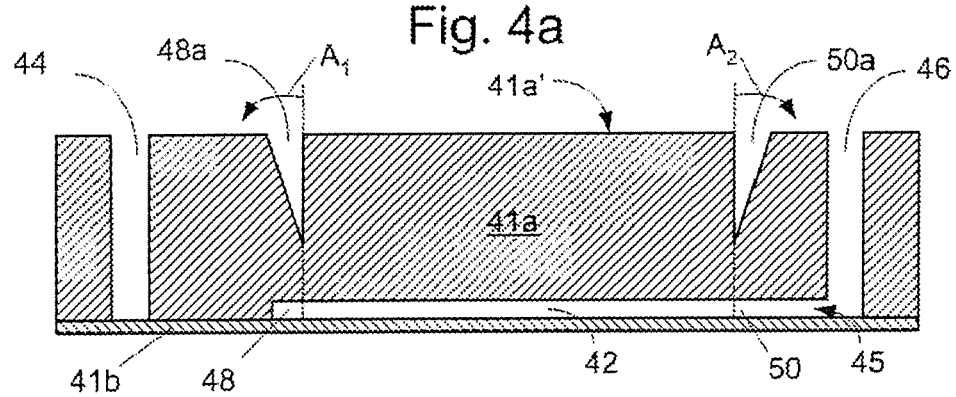

After the target molecule solution has filled the crystallisation channel sections 49 the liquid communication between the not shown branching channel section and the crystallisation channel sections 49 is broken by breaking the device in the weakening line in the flow break channel section 48 so that the various precipitants cannot flow into neighbouring crystallization channel sections 49. In FIG. 4b the arrow A1 shows the direction into which the part of the device comprising the branching channel section is pressed to break the device along the weakening line.

Figure 4C:
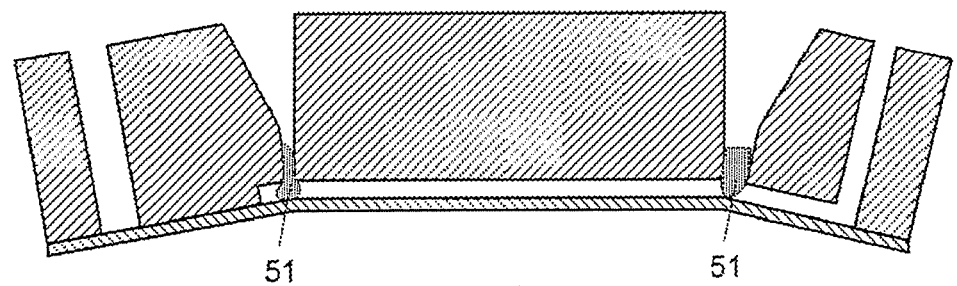
Figure 4D:
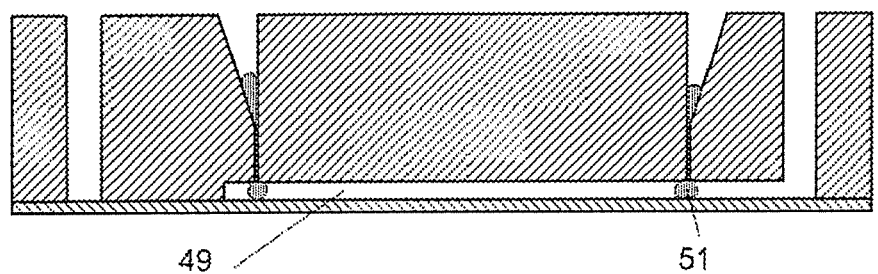

Simultaneously or after breaking the device along the weakening line in the flow break channel section 48 a sealant 51 may be provided as shown in FIGS. 4c and 4d. In the shown embodiment the sealing layer 41b is flexible and does not break when the device is broken along the weakening line. Thereby the part of the device comprising the branching channel section can be used to press the sealant into the liquid channel 42, to isolate the crystallisation channel section 49 from the branching channel section. In an alternative embodiment the sealing layer will also be broken when breaking the device along a weakening line.

After the device has been incubated for a time which is sufficient for the desired amount of precipitant to diffuse into the target molecule solution in the crystallisation channel section, the part of the device comprising the precipitation cavity 46 may accordingly be broken off along the weakening line provided in the flow break channel section 50 so that no more precipitant can flow into the crystallisation channel section, and simultaneously no more of the target molecules can flow into the precipitant in the precipitant cavity. Thereafter the incubation can be continued without further risk of loss of target molecules.

The part of the device comprising the precipitation cavity 46 is broken off in a similar manner as the part of the device comprising the branching channel section is broken off as described above. In FIG. 4b the arrow A2 shows the direction into which the part of the device comprising the precipitation cavity 46 is pressed to break the device along the weakening line. A sealant 51 is provided as described above.

Figure 5A:
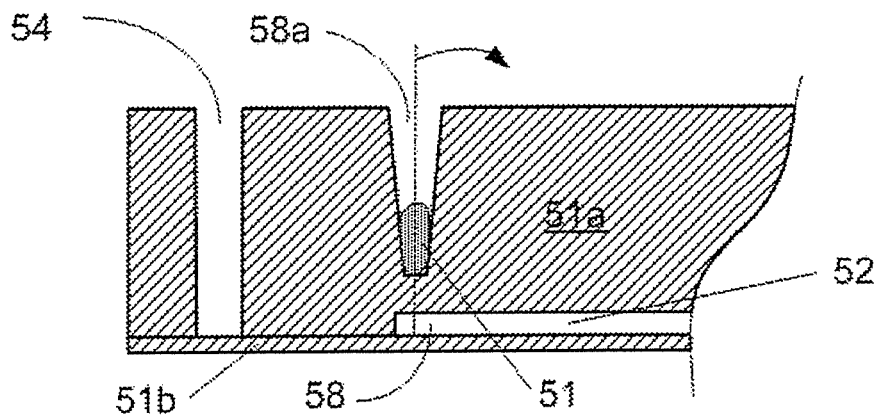
FIGS. 5a-b are cross sectional side views of a section of a further microfluidic device of the invention in various states during use.

FIGS. 5 a-b show another microfluidic device of the invention. This microfluidic device is a variation of the microfluidic device shown in FIGS. 4a-d, and differs there from in that the slit 58a for providing the weakening line has a flat bottom section. The device is provided in 2 layers:

- A top part 51a comprising grooves 52 for providing the liquid channel, apertures for the not shown precipitant cavities adjacent to respective precipitant inlets, and the solution inlet cavity 54, and a slit 58a for providing the weakening line in the flow break section 58.
- A sealing part 51b also constituting a bottom part, and in the form of sealing layer applied to cover said grooves and apertures 54.

Figure 5B:
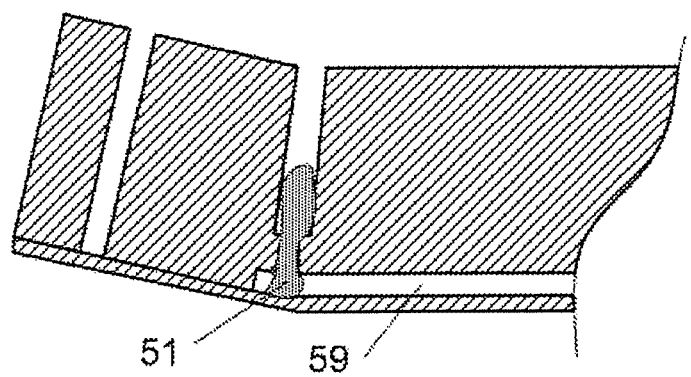

In FIG. 5b the device is broken along the weakening line and a sealant 51 is sealing the crystallisation channel section 59 from the not shown branching channel section.

Figure 6A:
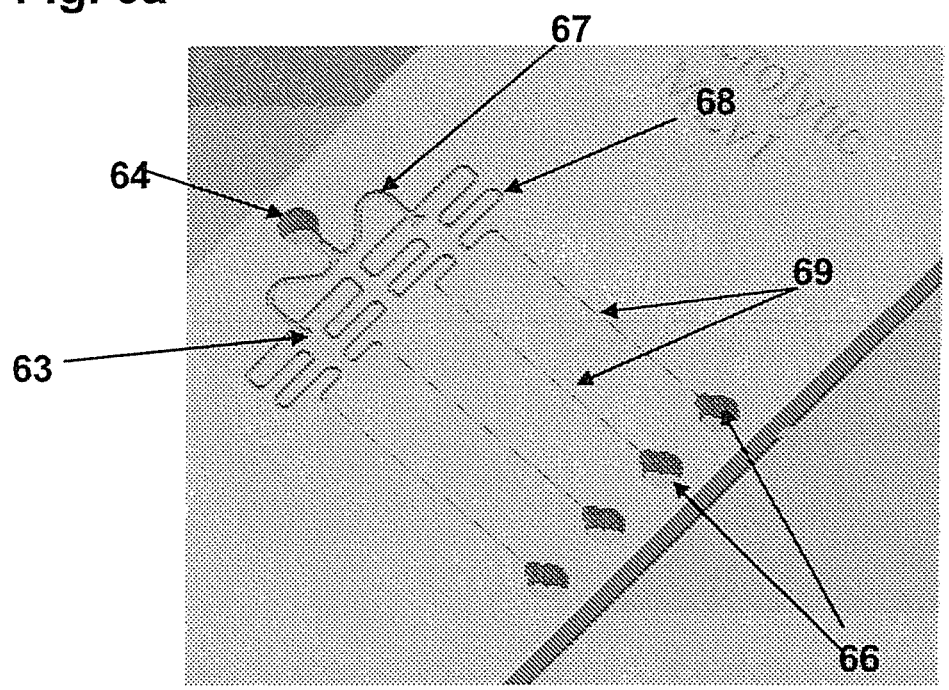
FIGS. 6a-b is a top part of a microfluidic device of the invention.
Figure 6B:
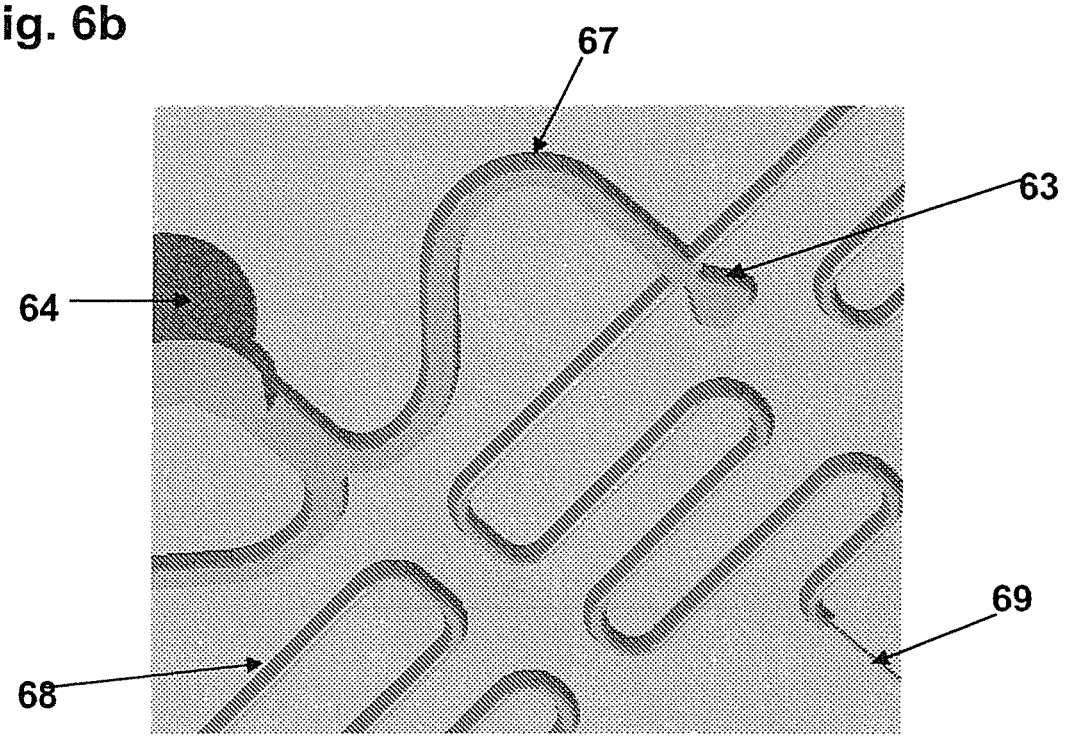

FIG. 6a is a picture of a top part of a microfluidic device of the invention. FIG. 6b is an expanded section of the picture 6a. The top part comprise a target molecule solution inlet 64, and 4 precipitant inlets 66 connected to each other by grooves 67, 68, 69 which is for providing the liquid channel. The grooves 67, 68, 69, are provided such that they respectively will provide a branching channel section 67, flow break channel sections 68, and crystallization channel sections 69. As it can be seen the groove 67 for the branching channel section are larger than the grooves 68 for the flow break channel sections, which again are larger than the grooves 69 for the crystallization channel sections. Such a construction is in particular desirable when the number of crystallization channel sections are relatively low, because is may be difficult to add the exact small but sufficient amount of target molecule solution to the target molecule solution inlet. By this construction the target molecule solution will due to capillary forces bee guided into the crystallization channel sections, and there will be plenty of space in the branching channel section for excess amounts of target molecule solution. The device further comprises additional fluid excess pockets 63 which may be used for collecting further target molecule solution.

The top part of the microfluidic device shown in FIGS. 6a and 6b can be fixed to a not shown bottom part e.g. a simple film or a plate to provide the liquid channel and thereby the total microfluidic device.

Figure 7A:
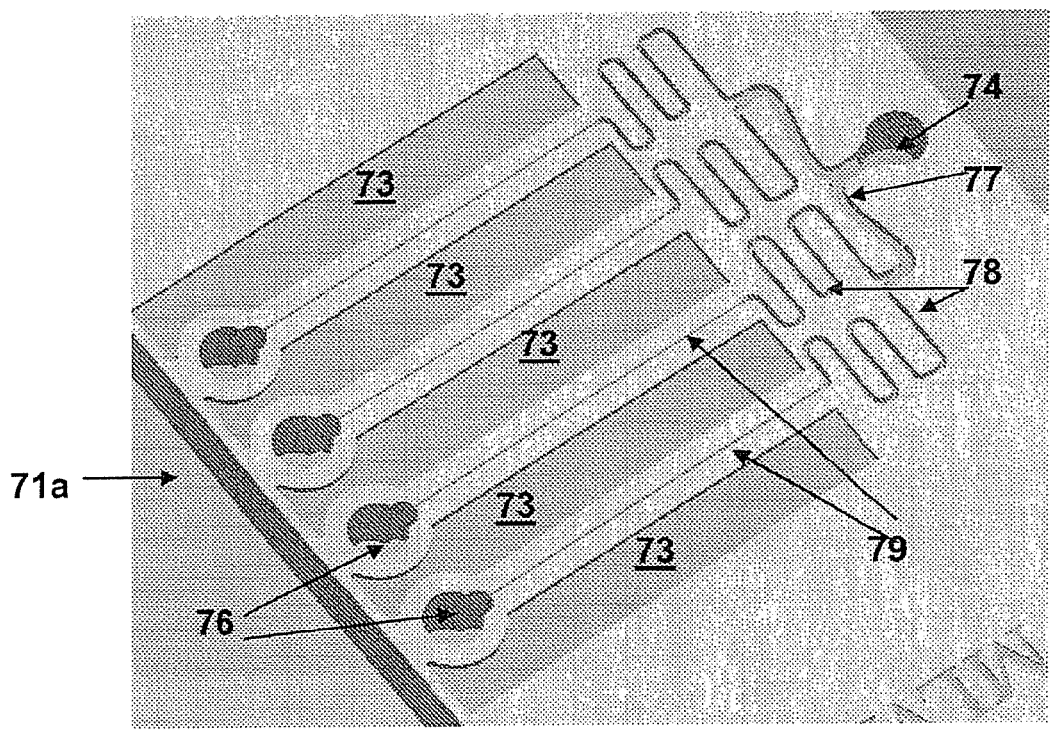
FIGS. 7a-b is a first part of a microfluidic device of the invention and a complete a microfluidic device respectively.
Figure 7B:
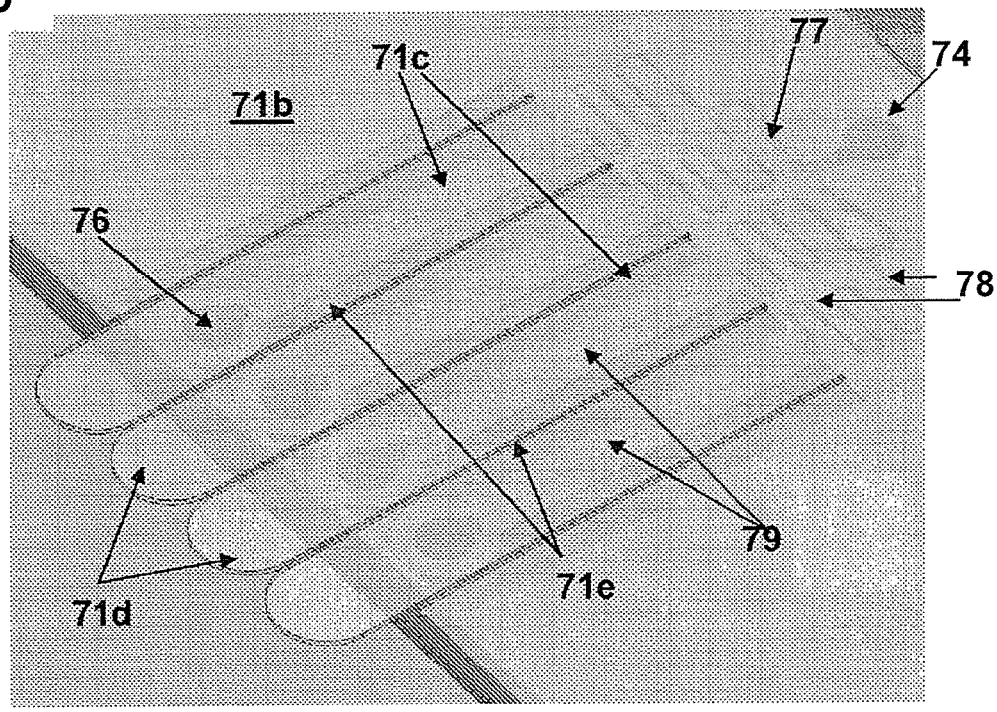

FIGS. 7a-b is a first part of a microfluidic device of the invention and a complete a microfluidic device respectively.

The microfluidic device of FIGS. 7a-b comprises a first part of a microfluidic device 71a with a not shown first face and an opposite groove face with grooves 77, 78, 79 for providing a branching channel section 77, flow break channel sections 78, and crystallization channel sections 79. The groove face is further provided with cavities 73 between the respective crystallization channel sections 79. The microfluidic device further comprises a lid part 71b comprising a plurality of at least partly removable lids 71c. The first part 71a further comprises a through going opening for providing a target molecule solution inlet 74 into the liquid channel and a number of through going opening for providing for providing precipitant inlets 76 into the liquid channel. The lid part 71b is fixed to the groove face of the first part 71a to provide respective inlets 74, 76 and the respective channel sections 77, 78, 79.

The removable lids 71c are applied above and sealed along the grooves 79 to provide the crystallization channel sections 79 of the liquid channel.

The removable lids 71c extend beyond the first part 71a to provide flanges 71d for individually removing the respective lids 71c.

The removable lids 71c are releasable connected to each other along the lines 71e.

Figure 8:
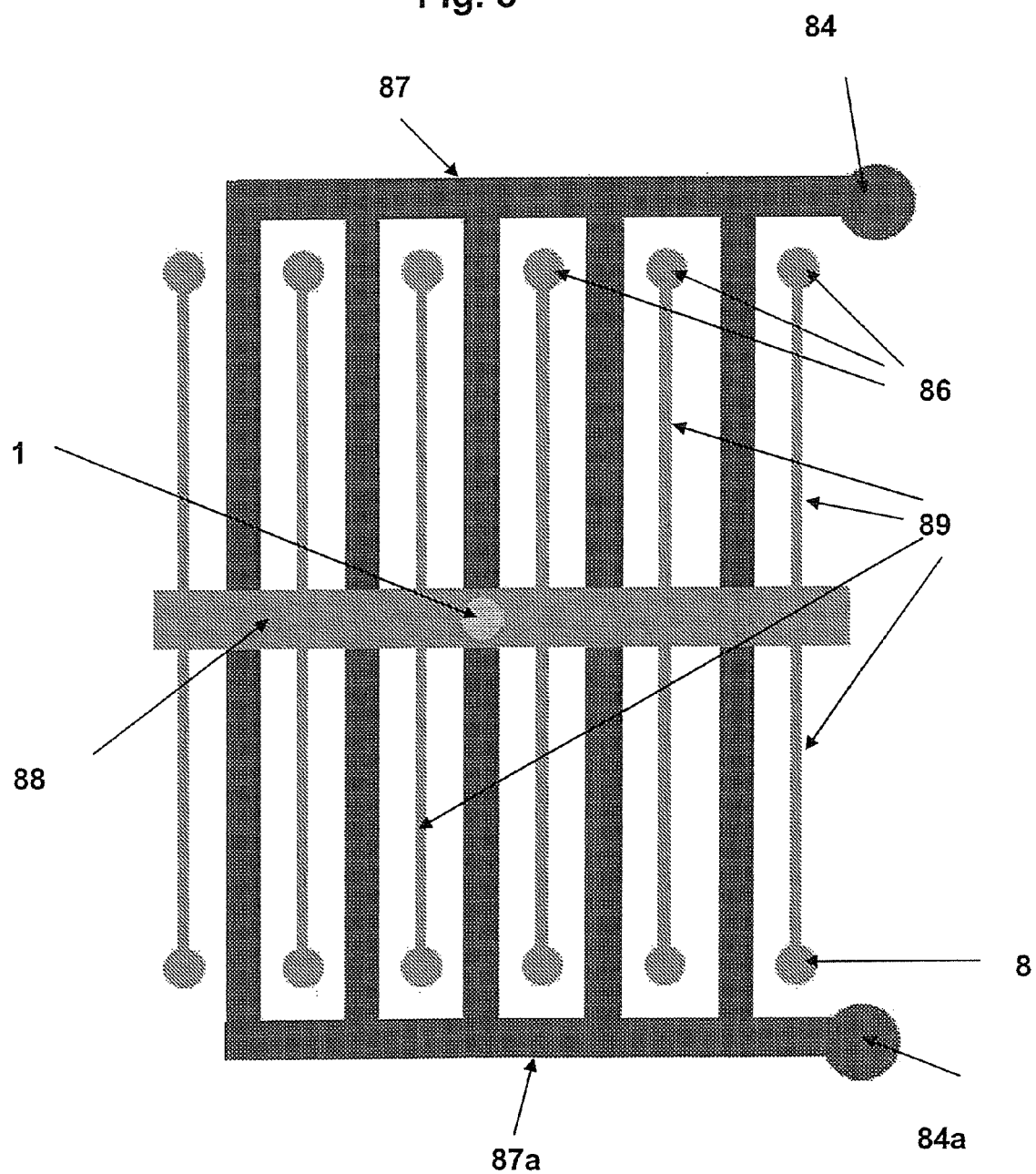
FIG. 8 is schematic drawing of a microfluidic device of the invention.

FIG. 8 is a schematic drawing of a microfluidic device of the invention wherein channel sections and their relation to each other are shown. The microfluidic device comprise a target molecule solution inlet 84 and a more air/gas opening/target molecule solution outlet 84a for excess amounts of target molecule solution. In principle the air/gas opening/target molecule solution outlet 84a could be replaced by one or more air/gas excesses for allowing the air/gas in the channel to escape as the target molecule solution are filling the channel section(s).

The microfluidic device also comprises 12 precipitant inlets 86, which are in liquid communication with the molecule solution inlet 84 via a branching channel section 87, a flow break channel section 88, and 12 crystallization channel sections 89. As it can be seen the flow break channel section 88 also partly constitute a flow break channel section, but for simplification in this example it is only called 'flow break channel section'. The air/gas opening/target molecule solution outlet 84a is in liquid communication with the flow break channel section 88 via a connecting channel section 87a. The flow break channel section 88 may be displaced in relation to the crystallization channel sections 89 such that target molecule solution which has entered the crystallization channel sections 89 will not flow back to the flow break channel section 88, however the crystallization channel sections 89 should have a larger capillary pull in the target molecule solution than the connecting channel section 87a, such that the target molecule solution will primarily flow into the crystallization channel sections 89 until they have been filled where after excess amount of target molecule solution will flow into the connecting channel section 87a. Alternative or in combination with the displacement the flow break channel section 88 may be arranged to have a lower capillary forces than the crystallization channel.

The microfluidic device further comprise a drain off opening 81, which during loading of the target molecule solution is closed e.g. by a plug or a vent and which after the crystallization channel have been filled is opened to drain off excess amounts of target molecule solution and simultaneously participating in providing the flow break in the flow break channel 88.

In use a target molecule solution is added to the target molecule solution inlet 84 and precipitant(s) is applied to the precipitant inlets 84a. The target molecule solution flows into the branching channel section 87, further into the flow break channel section 88, and into the 12 crystallization channel sections 89. When the crystallization channel sections 89 have been filled excess amount of target molecule solution will flow into the connecting channel section 87a and optionally further into the air/gas opening/target molecule solution outlet 84a. Should there be any target molecule solution left in the flow break channel section 88, it may be drained off by via the drain off opening 81.

Figure 9:
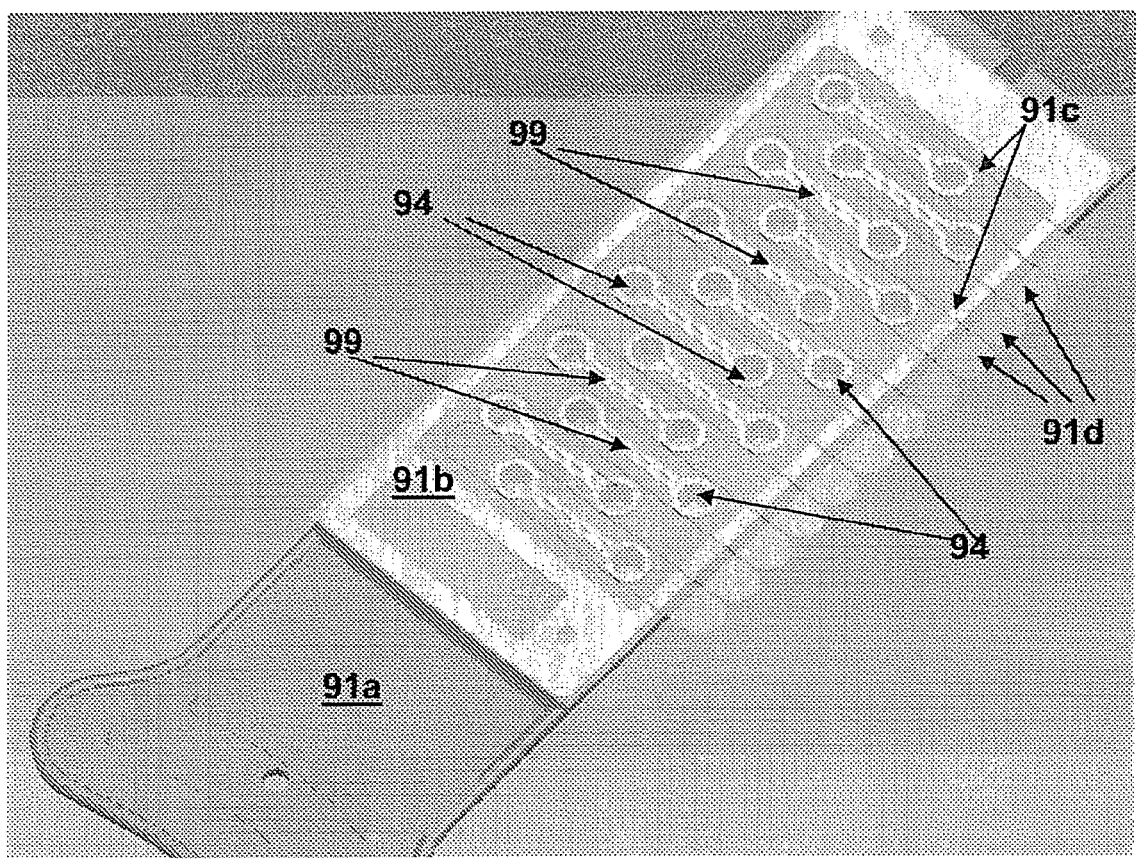
FIG. 9 shows a microfluidic device of the second aspect of the invention.

FIG. 9 shows a microfluidic device of the second aspect of the invention. The microfluidic device comprises a first part of a microfluidic device 91a with a not shown first face and an opposite groove face and with pair wise through going opening for providing respectively a target molecule solution inlet 94 and a precipitant inlet 94. The pair wise inlets 94 are connected by crystallization channel sections 99, which are provided by grooves in the groove face of the first part 91a which is covered by a lid part 91b. The lid part 91b comprises a plurality of at least partly removable lids 91c. The lid part 91b is fixed to the groove face of the first part 91a to provide the respective inlets 94 and the respective crystallization channel sections 99.

The removable lids 91c are applied above and sealed along the grooves 99 to provide the crystallization channel sections 99 of the liquid channel. The removable lids 91c extend beyond the first part 9 to provide flanges 91d for individually removing the respective lids 91c.

The removable lids 91c are releasable connected to each other along the lines 91e.

Figure 10:
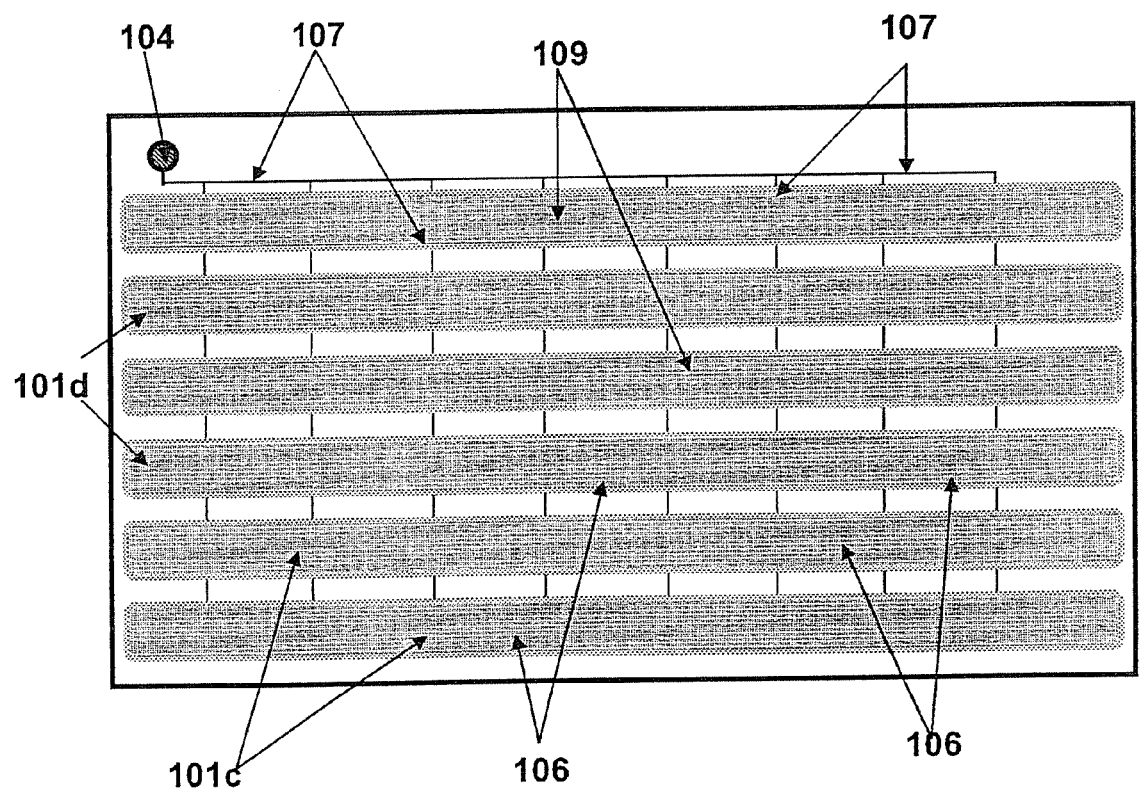
FIG. 10 is a top view of a further microfluidic device of the invention.

FIG. 10 is a top view of a further microfluidic device of the invention. This microfluidic device comprises a target molecule solution inlet 104, a liquid channel comprising a branching channel section 107, not shown flow break channel sections and crystallization channel sections 109. For each crystallization channel sections 109 the device comprises a precipitant inlet 106. The not shown flow break channel sections may preferably be provided at least partly by sections of the grooves 109 adjacent to the grooves 107 e.g. by providing these sections with a lower capillary force or by other means as herein described.

The microfluidic device further comprises removable lids 101c which e.g. may be as described above. The removable lids 101c may each comprise a flange 101d, which is not bonded to the underlying surface and the respective lids 101c may be removed by tearing in said respective flange 101d.

The invention claimed is:

1. A microfluidic device for promoting crystallization of target molecules, said device comprises a solid structure with a first face and an opposite second face and with a plurality of liquid channels,
    each of said liquid channels comprises a target molecule solution inlet and a precipitant inlet, each of the target molecule solution inlets being in liquid communication with a respective one of said precipitant inlets through a respective one of the liquid channels,
    each of said liquid channels comprises a crystallization channel section adjacent to a respective one of the precipitant inlets,
    each of said crystallization channel sections has a capillary stop arranged in or adjacent to the respective precipitant inlet,
    said microfluidic device comprises at least a first part having a first face and a groove face with a plurality of grooves for forming said crystallization channel sections and a plurality of removable lids which by tearing can be individually removed to expose at least a part of the crystallization channel sections for harvesting crystallized macromolecules,
    each of said lids having a second face and a groove face, wherein each of said removable lids is applied above and sealed along one or more of said grooves to said crystallization channel sections of the liquid channels.

2. A microfluidic device as claimed in claim 1 wherein the first part has at least one through going opening or a depression for providing at least one of the target molecule solution inlets into at least one of the liquid channels.

3. A microfluidic device as claim 2, wherein the first part has at least one through going opening or a depression for providing at least one of the precipitant inlets into at least one of the liquid channels.

4. A microfluidic device as claimed in claim 1, wherein said removable lids extend beyond the first part.

5. A microfluidic device as claimed in claim 4, wherein said removable lids extend beyond the first part to provide a flange for removing said lid.

6. A microfluidic device as claimed in claim 1, wherein said removable lids comprise a flange which is not bonded to the first part and which is arranged such that by tearing in said flange the lids are removed from the crystallization channel section.

7. A microfluidic device as claimed in claim 1, wherein said removable lids are sealed to the groove face of the first part along the groove by gluing and/or welding.

8. A microfluidic device as claimed in claim 1, wherein said lids are releasably connected to each other.

9. A microfluidic device as claimed in claim 1, wherein said microfluidic device comprises three or more removable lids.

10. A microfluidic device as claimed in claim 1, wherein said first part is of a material selected from glass, ceramics, metals, semiconductive materials, and polymers having a Young Modulus of at least 0.2 GPa.

11. A microfluidic device as claimed in claim 10, wherein said first part is essentially transparent.

12. A microfluidic device as claimed in claim 11, wherein said flow break arrangement is in the form of at least one of a) a capillary flow break wherein at least one flow break channel section is arranged to provide a lower capillary force to a liquid in said channel than the capillary forces provided to the liquid by said adjacent crystallisation channel section, b) a channel displacement, wherein at least a part of the flow break channel is displaced vertically with respect to at least one of the target molecule solution inlets and the crystallisation channel section, and c) a weakening line flow break wherein said solid structure is provided with a weakening line crossing the liquid channel in at least one flow break channel section.

13. A microfluidic device as claimed in claim 1, wherein said lids are made from a foil.

14. A microfluidic device as claimed in claim 13, wherein said foil is applied onto the groove face of the first part, glued or welded to the to the groove face along the at least one groove and partly or totally cut in sections to provide said removable lids.

15. A microfluidic device for as claimed in claim 1, said device comprises at least two precipitant inlets, crystallisation channel sections adjacent to said respective precipitant inlets and flow break channel sections arranged between said target molecule solution inlets and each of said crystallization channel sections, and said flow break channel sections comprise a flow break arrangement capable of breaking up the liquid communication between said target molecule solution inlets and said respective crystallisation channel sections.

16. A microfluidic device as claimed in claim 15, wherein said flow break arrangement is in the form of a difference in the respective flow break channel sections or a difference in the solid structure providing said flow break channel sections selected from at least one of a) the target molecule solution inlets and b) the crystallisation channel sections adjacent to said respective flow break channel sections.

17. A microfluidic device as claimed in claim 1, wherein the microfluidic device is made from two or more parts of equal or different material, which parts have been connected to each other.

18. A microfluidic device as claimed in claim 1, wherein the microfluidic device comprises at least two crystallization channel sections and a lid for each of said crystallization channel sections.

19. A microfluidic device as claimed in claim 1, wherein the microfluidic device comprises at least one part made from a material selected from glass, ceramics, metals, semiconductive materials and polymers.

20. A microfluidic device as claimed in claim 19, wherein the microfluidic device comprises at least one part made from a polymer material selected from acrylonitrile-butadiene-styrene copolymer, polycarbonate, polydimethylsiloxane (PDMS), polyethylene (PE), polymethylmethacrylate (PMMA), polymethylpentene, polypropylene, polystyrene, polysulfone, polytetrafluoroethylene (PTFE), polyurethane (PU), polyvinylchloride (PVC), polyvinylidene chloride (PVDC), polyvinylidine fluoride, styrene-acryl copolymers polyisoprene, polybutadiene, polychloroprene, polyisobutylene, poly(styrene-butadiene-styrene), silicones, epoxy resins, Poly ether block amide, polyester, acrylonitrile butadiene styrene (ABS), acrylic, celluloid, cellulose acetate, ethylene-vinyl acetate (EVA), ethylene vinyl alcohol (EVAL), fluoroplastics, polyacetal (POM), polyacrylates (acrylic), polyacrylonitrile (PAN) polyamide (PA), polyamide-imide (PAI), polyaryletherketone (PAEK), polybutadiene (PBD), polybutylene (PB), polybutylene terephthalate (PBT), polyethylene terephthalate (PET), polycyclohexylene dimethylene terephthalate (PCT), polyketone (PK), polyester/polythene/polyethene, polyetheretherketone (PEEK), polyetherimide (PEI), polyethersulfone (PES), polyethylenechlorinates (PEC), polyimide (PI), polylactic acid (PLA), polymethylpentene (PMP), polyphenylene oxide (PPO), polyphenylene sulfide (PPS), polyphthalamide (PPA), and mixtures thereof.

21. A microfluidic device as claimed claim 1, wherein the microfluidic device comprises at least one precipitant cavity in liquid communication with said precipitant inlet, said at least one precipitant cavity is in the form of a semi-closed precipitant cavity.

22. A microfluidic device as claimed in claim 21, wherein said at least one precipitant cavity has a conical shape.

23. A microfluidic device as claimed in claim 1, wherein at least one crystallisation channel section has a capillary stop arranged in or adjacent to the precipitant inlet.

24. A microfluidic device as claimed in claim 1, wherein said liquid channel in the major part of its length has a capillary dimension.

25. A microfluidic device as claimed in claim 1, wherein said liquid channel in the major part of its length has at least one cross-sectional dimension below 1000 µm.

26. A microfluidic device as claimed in claim 1, wherein the microfluidic device comprises at least two crystallisation channel sections, and wherein said crystallisation channel sections are essentially parallel to each other.

27. A microfluidic device as claimed in claim 1, wherein the microfluidic device comprises at least two crystallisation channel sections, and wherein said precipitant cavities have a smallest distance to each other of between about 0.5 and about 5 mm.

28. A microfluidic device as claimed in claim 1, wherein said device further comprises a membrane incorporated in at least one of said crystallisation channel sections.

29. A microfluidic device as claimed in claim 28, wherein said membrane is a filter membrane preventing the target molecules from diffusing into a precipitant in liquid contact with the precipitant inlet.

30. A microfluidic device as claimed in claim 1, in combination with an aqueous target molecule solution.

31. A microfluidic device in combination with a target molecule solution as claimed in claim 30, wherein said liquid channel comprises a wall surface extending along a circumference of the channel and in the length of the channel, said wall surface in at least one crystallisation channel section, in at least a part of its circumference has surface tension which is higher than the surface tension of the target molecule solution.

32. A microfluidic device in combination with a target molecule solution as claimed in claim 30, wherein said liquid channels in the major part of their lengths have a capillary dimension determined in relation to the target molecule solution.

33. A method of harvesting crystals from a crystallization channel section of a microfluidic device as claimed in claim 1, said method comprises selectively removing said lid and removing the crystals.

34. A method of harvesting crystals as claimed in claim 33, wherein the microfluidic device comprises two or more crystallization channel sections and a lid for each of said crystallization channel sections, said method comprises harvesting crystals from one of said crystallization channel sections by selectively removing a lid covering said one crystallization channel section and removing the crystals.

* * * * *